United States Patent [19]
Sugiura et al.

[11] Patent Number: 6,015,979
[45] Date of Patent: Jan. 18, 2000

[54] NITRIDE-BASED SEMICONDUCTOR ELEMENT AND METHOD FOR MANUFACTURING THE SAME

[75] Inventors: Lisa Sugiura, Kawasaki; Masayuki Ishikawa, Yokohama; Shinya Nunoue, Ichikawa; Masaaki Onomura; Masahiro Yamamoto, both of Kawasaki, all of Japan

[73] Assignee: Kabushiki Kaisha Toshiba, Kawasaki, Japan

[21] Appl. No.: 09/143,560

[22] Filed: Aug. 28, 1998

[30] Foreign Application Priority Data

Aug. 29, 1997 [JP] Japan .................................. 9-234884
Mar. 3, 1998 [JP] Japan ................................. 10-050773

[51] Int. Cl.$^7$ .......................... H01L 27/15; H01L 31/12; H01L 31/153; H01L 33/00; H01L 23/58
[52] U.S. Cl. .............................. 257/86; 257/103; 257/631
[58] Field of Search ............................. 257/86, 103, 913, 257/631

[56] References Cited

U.S. PATENT DOCUMENTS 5,880,485  3/1999  Marx et al. .

FOREIGN PATENT DOCUMENTS 8-64791   3/1996  Japan .
8-186080  7/1996  Japan .

OTHER PUBLICATIONS

Nakamura et al., Bulletin of Solid State Physics and Applications (Japan Society of Applied Physics), vol. 4, No. 2, May 28, 1998, p. 53.

Nakamura et al., InGaN/GaN/AlGaN–Based Laser Diodes with Modulation–Doped Strained–Layer Superlattices, (1997), pp. 1568–1571.

Nakamura et al., InGaN/GaN/AlGaN–based laser with modulation–doped strained–layer superlattices grown on an epitaxially laterally overgrown GaN substrate, (1998), pp. 211–213.

Nakamura et al., High–power, Long–Lifetime InGaN/GaN/AlGaN–Based Laser Diodes Grown on Pure GaN Substrates, (1998), pp. 309–312.

Akira Sakai, Defect structure in selectively grown GaN films with low threading dislocation density, (1997),pp. 2259–2261.

NAM et al., Lateral epitaxy of low defect density GaN layers via organometallic vapor phase epitaxy, (1997), pp. 2638–2640.

Upder et al., News from ISCS in San Diego, *The Materials Research Society*, (1998), 1 page.

*Primary Examiner*—Stephen D. Meier
*Attorney, Agent, or Firm*—Foley & Lardner

[57] ABSTRACT

Nitride-based semiconductor element comprises a first layer, a mask formed on the first layer and has a plurality of opening portions, a nitride-based compound semiconductor layer formed on the mask, the nitride-based compound semiconductor layer including a first region having threading dislocations produced in such a manner that, in approximately a middle portion between two adjacent ones of the plurality of opening portions in the mask, a plurality of dislocations extend in a vertical direction to a surface of the mask, and a second region which comprises portions other than the middle portions and free from the dislocations, and a desired element structure formed on the semiconductor layer.

18 Claims, 14 Drawing Sheets

THREADING DISLOCATION

THREADING DISLOCATION

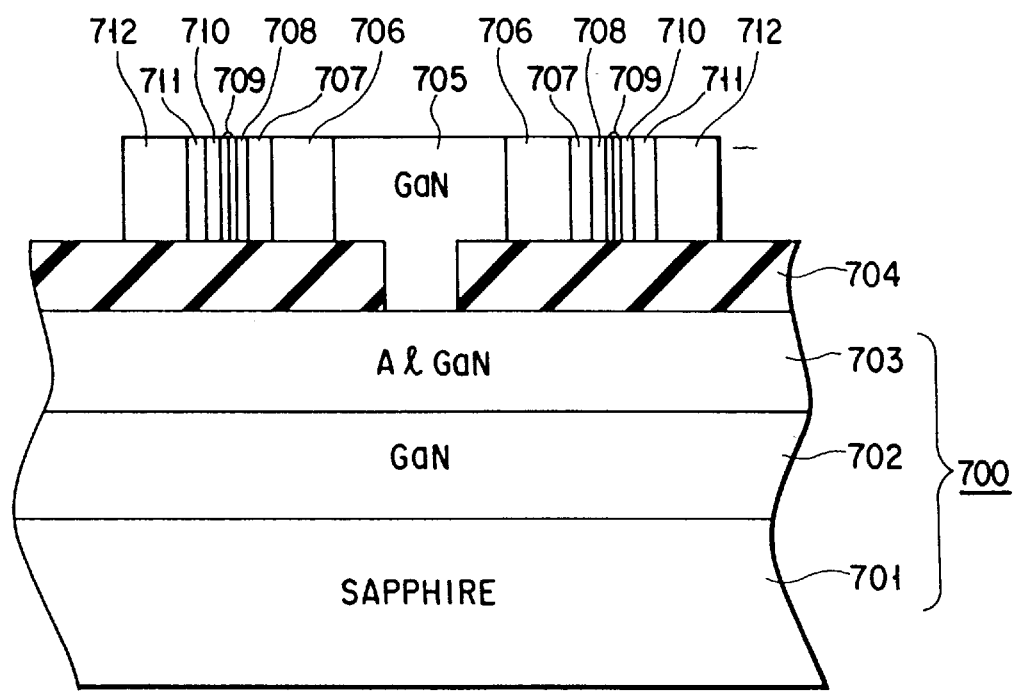
F I G. 19

NITRIDE-BASED SEMICONDUCTOR ELEMENT AND METHOD FOR MANUFACTURING THE SAME

BACKGROUND OF THE INVENTION

The present invention relates to a nitride-based semiconductor element such as a semiconductor laser, a light-emitting diode, an electronic device, or the like and a method for manufacturing the same.

Recently, attention is being drawn to nitride-based semiconductors such as, mainly, GaN, as the material for light-emitting diodes (LED) and semiconductor lasers (LD) which emit short-wave light ranging from the blue color to the ultraviolet region. As the substrates for growth of the above-mentioned nitride-based compound semiconductors, sapphire substrates are used most popularly, and, besides, SiC substrates, $MgAl_2O_4$ substrates, etc. are also used.

As the method of forming a nitride-based compound semiconductor layer such as, mainly, GaN on a sapphire substrate or a SiC substrate, the metallo-organic chemical vapor deposition (MOCVD) method is used most popularly. If, in case a nitride-based compound semiconductor layer comprising GaN or the like on a sapphire substrate by the use of MOCVD method, the nitride-based compound semiconductor layer is grown directly on the substrate at a temperature (1000° C. or higher) at which single crystal can grow, an island-shaped growth is markedly effected, and thus, no film with a good flatness can be obtained.

Thus, there is used the method according to which, before growing a nitride-based compound semiconductor layer at a temperature of 1000° C. or higher at which generally the growth of single crystal is possible, a buffer layer composed of AlN or GaN is grown on the substrate at a low temperature of about 500 to 600° C. By the insertion of the buffer layer thus formed, the growth of a nitride-based compound semiconductor layer having a good flatness has become possible.

However, at the early stage of growth at the high temperature, islands each growing around a growth nucleus are formed; and, when these islands coalesce, crystal defects such as dislocations, stacking faults, tubular holes, etc. are produced at a high density on the boundaries between the islands. In the case of the growth of a nitride-based compound semiconductor layer on a sapphire substrate, dislocations are produced at such a high density as about $10^8$ to $10^{11}$ cm$^{-2}$, and these dislocations exist within the grown layers as threading dislocations which have propagated in the direction of growth. Therefore, these threading dislocations extend out to surface of the grown layers through the active layer in the element structure of a nitride-based short-wave semiconductor laser or the like.

Here, the dislocations induced when the islands coalesce in the case of an island-shaped growth will be described by reference to FIGS. 1A to 1C. As shown in FIG. 1A, growth nuclei are formed at random at the early stage of the growth. In this case, it is not possible to execute control over the positions at which the dislocations are produced and the positions at which such dislocations are not produced. As the growth goes on, threading dislocations are caused due to the coalescence of the islands as shown in FIG. 1B. The dislocation density can be controlled through the growth condition, but the limit of the control is to reduce the dislocation density as far as $1\times10^8$ cm$^{-2}$. Further, even if the thickness of the nitride-based compound semiconductor layer is increased as shown in FIG. 1C, the threading dislocation remains. In case elements have been fabricated, dislocations at the density of $10^8$ to $10^{11}$ cm$^{-2}$ turn out to exist.

As the adverse effects exerted by the existence of dislocations on nitride-based semiconductor elements, the following ones are pointed out:

(1) A nitride-based compound semiconductor layer which has a high crystal defect density is poor in crystallizability, and the electrical characteristics are inferior. That is, the concentration of the background donor (carriers) is high, and the Hall mobility is small.

(2) In the case of a nitride-based compound semiconductor layer having a high crystal defect density, the optical characteristics thereof are inferior in that, for instance, the lifetime of the carriers is short, and the luminous intensity is low.

(3) At the tip end of a threading dislocation (the point at which the threading dislocation intersects the surface of the grown layer), pits (holes) are apt to be produced; for instance, in the process through which an InGaN-based active layer of the multi-quantum well structure (MQW) fabricated by growing a thin film of about, e.g. several nm, pits are formed, so that the orderliness of the multi-quantum well structure is disturbed, the desired structure in the luminous region of the element is spoiled, as a result of which the luminous pattern in the grown surface becomes non-uniform.

(4) Due to the existence of the pits, the surface flatness (morphology) of the multi-layer film for an element such as a semiconductor laser or the like is spoiled, which results in the occurrence of inconveniences in the formation of the electrodes.

(5) When electrical power is fed, the electrode material diffuse through the threading defects such as tubular holes etc.

(6) When electrical power is fed or when a heat treatment is performed, a dopant such as Mg or the like diffuses into layers other than a desired layer into which a doping has been made intentionally, thus adversely affecting the element.

Due to inconveniences as mentioned above, the initial characteristics and reliability of the element are spoiled. However, the problem concerning the reduction in the density of crystal defects such as threading defects etc. cannot be solved by the conventional methods within the range of the optimization of the growth condition of the low-temperature buffer layer and the growth condition, at a high temperature, of nitride-based compound semiconductor layer, and other measures.

Further, among the nitride-based compound semiconductors, particularly the InGaAlN series are hopeful for use as short-wave light sources containing the ultraviolet rays, thus attracting attention. However, in the case of this series of material, the low-refraction layer containing aluminum cannot be grown thick, so that no sufficient optical confinement can be effected. Due to this, there arises problems such as the problem that the threshold value is high and the mode is not stabilized.

As stated above, in the case of a light-emitting element and an electronic device fabricated by the use of a nitride-based semiconductor layer, crystal defects such as threading dislocations etc. are produced at a high density even if growth techniques for the growth of, e.g. low-temperature growth buffer layers are used, and, due to the existence of these crystal defects, the initial characteristics of and reliability for the elements are kept from being improved.

BRIEF SUMMARY OF THE INVENTION

It is the object of the present invention to provide a nitride-based semiconductor element constituted in such a manner that a nitride-based compound semiconductor layer which is low in the density of crystal defects such as dislocations, stacking faults, tubular holes, etc. and has excellent crystallability, electrical characteristics, and optical characteristics can be formed on a substrate made of sapphire or the like to thereby enhance the manufacturing yield, initial characteristics, and reliability and, also, to provide a method for the manufacture of the nitride-based semiconductor element.

In order to achieve the above-mentioned object, the nitride-based semiconductor element according to a first aspect of the present invention comprises a first layer, a mask formed on the first layer, the mask having a plurality of opening portions, a nitride-based compound semiconductor layer formed on the mask, the nitride-based compound semiconductor layer including a first region which has threading dislocations produced in such a manner that, in approximately a middle portion between two adjacent opening portions of the plurality of opening portions in the mask, a plurality of dislocations extend vertically to a surface of the mask, and a second region which comprises portions other than the middle portions and free from the dislocations, and a desired element structure formed on the semiconductor layer.

The desired element structure is desirably formed substantially on the second region.

More specifically, when the desired element structure is an FET, at least the source and drain regions and the gate electrode of the FET are formed on the second region. When the desired element structure is a diode, the p and n regions and the current path of the junction thereof are formed on the second region.

The light-emitting element according to a second aspect of the present invention comprises a first layer, a mask formed on the first layer, the mask having a plurality of opening portions, a nitride-based compound semiconductor layer formed on the mask, the nitride-based compound semiconductor layer including a first region which has threading dislocations produced in such a manner that, in approximately a middle portion between two adjacent opening portions of the plurality of opening portions in the mask, a plurality of dislocations extend vertically to a surface of the mask, and a second region which comprises portions other than the middle portions and free from the dislocations, and a light-emitting layer formed substantially on the second region of the nitride-based compound semiconductor layer, the light-emitting layer being sandwiched between current injections layers.

In the above-mentioned first and second aspects, the material of the mask is desirably inactive at a high temperature of 1000° C. or higher in an atmosphere comprising at least one of hydrogen, nitrogen and ammonia.

Further, it is desirable to constitute the element in such a manner that the first layer comprises one selected from a group consisting of AlGaN, InGaN, AlN, GaN, and materials obtained by adding B to the foregoing, Si, SiC, sapphire and a laminated film made of the foregoing.

The plurality of opening portions of the mask is desirably formed periodically.

Further, the plurality of opening portions in the mask are preferably each formed into a stripe-like shape in a direction perpendicular to an a-axis <11-20> of the nitride-based compound semiconductor layer.

Note that <11-20>, for example, in this specification includes directions of a form which are in symmetric relations with each other.

A density of the threading dislocations in the nitride-based compound semiconductor layer desirably ranges from $10^3$ cm$^{-2}$ to $10^7$ cm$^{-2}$ inclusive.

Further, the nitride-based compound semiconductor layer includes a third region in which a plurality of dislocations extending along the surface of the mask from the plurality of opening portions in the mask, and the second region exists on the third region.

Further, a surface of the nitride-based compound semiconductor layer on the mask is substantially flat.

The nitride-based compound semiconductor layer is desirably composed of $Ga_xIn_yAl_zB_{1-x-y-z}N$ (wherein $0 \leq x, y, z \leq 1$).

The mask is constituted in such a manner that, on the first layer, either of a plurality of opening portions which are each triangular or hexagonal in shape and a plurality of un-opened portions are periodically formed, the nitride-based compound semiconductor layer comprises:

the first region which is formed on the un-opened portions of the mask and in which the threading dislocations are contained in a state extending in a vertical direction to the surface of the mask, a third region which is formed on the opening portions and the un-opened portions of the mask and, in which the dislocations extend along the surface of the mask, and the second region which is formed on the third region and free from the dislocations.

Nitride-based semiconductor element may alternatively be constituted in such a manner that, the first layer has a plurality of projections periodically formed on a surface thereof, on surfaces of the projections, the un-opened portions of the mask are formed, and in the opening portions of the mask, the underlying layer forms a junction with the nitridebased compound semiconductor layer.

It is desirable to ensure that the plurality of opening portions formed in the mask are formed in the shape of stripes, and, in case it is assumed that W stands for the width of the un-opened portions, p stands for the cyclic period of the plurality of opening portions, as stands for the lattice constant of the first layer, and an stands for the lattice constant of the nitride-based compound semiconductor layer, either one of the following expressions:

$-1\% \leq w/p - an/as \leq 1\%$, and $-1\% \leq (p-w)/p - an/as \leq 1\%$.

The method for the manufacture of a nitride-based semiconductor element according to a third aspect of the present invention comprises the step of forming, on a first layer, a mask which has a plurality of opening portions, the step of depositing a nitride-based compound semiconductor layer, on the first layer on which the mask has been formed, by utilizing lateral growth on the mask in such a manner that a region in which crystal defects propagating in a direction of perpendicular to a surface of the mask are small in number is formed, and the step of forming a desired element structure on the nitride-based compound semiconductor layer.

The step of forming the mask desirably includes the step of forming stripe-shaped opening portions in the mask in a direction perpendicular to an a-axis <11-20> of the nitride-based semiconductor element layer.

The step of depositing the nitride-based compound semiconductor layer desirably includes the step of depositing the nitride-based compound semiconductor layer so as to have a thickness in which dislocations propagating along the surface of the mask cease to exist.

In the method for the manufacture of a nitride-based semiconductor element, the first layer is desirably composed of one selected from a group consisting of AlGaN, InGaN, AlN, GaN, and materials obtained by adding B to the foregoing, Si, SiC, sapphire and a laminate film made of the foregoing.

According to the present invention, in case a nitride-based compound semiconductor layer is formed on a first layer (substrate) composed of a sapphire, SiC or the like or on a first layer constituted in such a manner that, on such a substrate, a nitride-based semiconductor layer made of GaN, GaAlN or the like is formed, a mask which has opening portions such as holes, grooves, or the like is formed on the first layer, and, on the first layer on which the mask has thus been formed, a nitride-based semiconductor layer is deposited through a low-temperature buffer layer or not through a low-temperature buffer layer. At the initial stage of the growth thereof, only the openings are filled up; and, when the openings are thus filled up, a lateral growth is hastened or promoted on the mask. Even at the minimum, the growth is continued till the mask comes to be covered by the lateral growth, a thin film having an excellent flatness is formed or till the dislocations along the growth surface, in a sectional TEM observation, cease to exist and the density of the dislocations extending through the layer in the growth direction becomes constant. Next, on the thus grown thin film, an element structure for realizing the desired nitride-based semiconductor element is formed.

In the case of a lateral growth, as shown in the SEM photograph of FIG. 2, threading dislocations are produced (only in the coalesced portions), but the mask openings which constitute growth nuclei are periodically arranged, so that those positions at which dislocations are produced and those other positions at which such dislocations are not produced can be controlled. Further, by suitably selecting the intervals between the openings in the mask, the threading dislocation density can be reduced to $10^3$ to $10^7$ cm$^{-2}$ inclusive. As a mask suitable for promoting the lateral growth, an SiO$_2$ mask made in the form of lines extending in the direction perpendicular to the a-axis <11-20> of the nitride-based semiconductor layer is pointed out by way of example. The width of the opening portions of the mask is set to 5 $\mu$m or less and, more preferably, 2 $\mu$m or less, or the width of the non-opening portion of the mask is set to 2 $\mu$m or more and, more preferably, 5 $\mu$m or more.

That is, in the formation of the nitride-based semiconductor element, a mask in which has openings of a desired size and a desired shape is formed on the first layer (substrate), and, on the mask, an element structure for the nitride-based semiconductor element is formed, whereby the lateral growth at the early stage of the growth can be utilized to substantially enhance the crystal quality of the multi-layer film for the element, as a result of which the manufacturing yield, initial characteristics and reliability of the elements can be enhanced to a substantial degree.

Further, in the case of a nitride-based semiconductor laser which emits light from the end face of the laminate structure, effects such as the reduction of the threshold current, the increase of the optical output, the enhancement in useful life, the enhancement of the yield of the element, etc, can be obtained due to the reduction of the threading dislocations and pits, and, in the case of a nitride-based light-emitting diode, effects such as the enhancement in the luminous intensity, the uniformity of light emission in the surface, the element stability, and the yield, etc. can be obtained.

Further, in the case of a surface emitting type nitride-based semiconductor laser, the reflectance of the reflector is substantially enhanced, so that the element characteristics are largely enhanced. Further, also in the case of an electronic device, the element characteristics are greatly enhanced due to effects such as the effect that the mobility of electrons in the electron movement layer is increased due to the reduction in crystal defects, so that the conductance of the transistors is largely increased as compared with that of the conventional type.

The first effect of the present invention that the crystal quality of the nitride-based compound semiconductor is improved, whereby the element characteristics are improved is common to all the nitride-based semiconductor elements according to the present invention such as light-emitting elements, electronic devices, etc. Further, by selection of such a mask material as to make the best use of the characteristics of the element, there can be obtained various effects such as the utilization thereof as the reflective film in a laser resonator, the utilization thereof as a grating, the enhancement in the reliability of the element as a result of enhancement in the thermal characteristic achieved in case a material having a good heat dissipation is used, the reduction in voltage due to the increase in the excitation carriers caused in case a material having a poor heat conductivity is used; and thus, the merits of the first aspect of the present invention are excellent.

Further, according to the present invention, in case a nitride-based semiconductor element is formed on a first layer made of sapphire, SiC or the like, first a mask which has triangular or hexagonal opening portions or non-opening portions (islands) is periodically formed on the first layer or a nitride-based semiconductor layer, and, on the first layer on which the mask has thus been formed, a nitride-based semiconductor layer is formed by crystal growth.

At the initial stage of the crystal growth, a pyramid-shaped nitride-based semiconductor crystal (first nitride-based semiconductor layer) containing crystal defects in the vertical direction is grown on the opening portions of the mask, and, when the apex of the pyramid-shaped crystal is formed, the crystal growth is promoted on the mask in the lateral direction (lateral growth). In this case, in the growth of the pyramid-shaped nitride-based semiconductor, crystal defects such as threading dislocations extend in the vertical direction, but, in the case of the lateral growth, crystal defects such as threading dislocations extend in the lateral direction as the crystal growth goes on and cease at the points where they are coalesced with the crystal laterally grown from the opposite side. Therefore, the dislocation density—which is $10^{10}$ cm$^{-2}$ or higher due to the lattice mismatch etc. in the case of a nitride-based semiconductor element formed when no lateral growth has been made—can be reduced by three orders of magnitude or more in case a lateral growth is effected.

In the case of the lateral growth using a mask comprising a stripe pattern, not only a dislocation suppression effect cannot be obtained in the stripe direction, but also the dislocations produced can escape only in one direction perpendicular to the stripes. In contrast, in the case of a mask comprising a triangular or hexagonal pattern, there are three directions in which the degree of freedom for the dislocations to escape laterally lies; and thus, there is obtained the effect that the threading dislocation density can be largely reduced.

In order to perform a stable lateral growth, it is important to set the directions of the respective sides of the mask pattern so as to be parallel to the <1-100> directions of the nitride-based semiconductor formed by crystal growth, in which case the growth uniformly goes on in three directions in which the lateral growth is effected most easily. The growth of a nitride-based semiconductor carried out by the use of a mask pattern shifted by 90° from the <1-100> direction of the nitride-based semiconductor is most unstable; and thus, no pyramid-shaped semiconductor nucleus is produced. That is, the crystal growth of the nitride-based semiconductor has a high c-axis orientation, so that, by patterning only the <1-100> direction to the utmost degree in the case of a hexagonal or triangular mask pattern, it is possible to form a pyramid-shaped nitride-based semiconductor with less initial dislocations and to effect a stable lateral growth.

Further, edge dislocations and screw dislocations result from the lattice mismatching between the first layer (substrate) and the nitride-based semiconductor, so that, in the case of, e.g. the c-surface of sapphire (0001) and the c-surface of gallium nitride, about 16% of lattice mismatch is caused. In this case, by equalizing the mismatch rate and the ratio between the width and cyclic period of the pattern to each other, the occurrence of dislocations can be suppressed. Further, by performing lateral growth using a mask several times, the dislocation density can be further reduced, but in this case, the cyclic period, shape, size, etc. of the mask are not matched with those of the underlying mask, whereby an excellent effect can be obtained.

On the other hand, if $1 \times 10^{17}$ cm$^{-3}$ or more of the impurity for controlling the conductivity type of silicon or the like exists in the nitride-based semiconductor, then the dislocation density increases. Therefore, by intentionally doping no impurity into the nitride-based semiconductor layer, it is possible to obtain a nitride-based semiconductor with a less density of threading dislocations.

As described above, in the nitride-based semiconductor element formed in the upper portion by utilizing the lateral growth using a hexagonal or triangular mask pattern, it is possible to form a high-quality nitride-based semiconductor layer with less crystal defects such as threading dislocations, as a result of which the yield, characteristics and reliability of the element can be greatly enhanced.

Further, according to the present invention, in a semiconductor element including the stack structure of nitride compound semiconductor layer (such as, e.g. InGaAlN), a structure in which a stepped shape and a mask (such as, e.g. SiO$_2$) are partially formed in a portion of the InGaAlN layer is employed; this fact has an important significance, which will be described below.

As described above, in the case of the conventional GaN-based semiconductor element, there is the problem that the optical confinement is low, and the oscillation threshold value is high. Thus, the use of the structure formed in such a manner that, at the substrate side of the stack structure body, a stepped shape and a mask (SiO$_2$) are partially formed as according to the present invention has a great significance. In the case of using this structure, for instance the AlGaN starts to grow laterally, so that, as shown in FIG. 3, the thickness of the film in which cracks are caused as in the case of the conventional structure is increased as shown in FIG. 3. In this way, a film containing a sufficiently thick aluminum can be formed by growth, and thus, a semiconductor laser having a stabilized mode and a low oscillation threshold value can be realized.

As has been described above, according to the present invention, a mask in which opening portions are provided is formed on the substrate, and, on the mask, a nitride-based compound semiconductor layer is formed, whereby a nitride-based compound semiconductor layer which has a low density of crystal defects such as dislocations, stacking faults, tubular holes, etc. and also has excellent crystallizability, electrical characteristics, and optical characteristics can be formed on a substrate made of sapphire or the like, whereby the yield, initial characteristics and reliability of semiconductor elements each using a nitride-based compound semiconductor can be enhanced. Further, in addition to the above, by setting the pattern of the mask to a hexagonal or a triangular shape, it becomes possible to further reduce crystal defects such as threading dislocations.

Further, by the use of the structure constituted in such a manner that, in a portion of the InGaAlN layer, a stepped shape and a mask are partially formed, it becomes possible to crystal-grow a sufficiently thick nitride-based semiconductor layer containing aluminum, whereby a semiconductor laser having a low oscillation threshold value with a stabilized mode can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 16A and 16B show sectional SEM photographs of the nitride-based semiconductor growth layer according to a tenth embodiment of the present invention, of which FIG. 16A shows the case where a stripe-shaped mask is formed in the <11-20> direction of a sapphire substrate, while FIG. 16B shows the case where a stripe-shaped mask is formed in a direction differing by 90° with respect to the case of FIG. 16A;

FIGS. 18A to 18C are, respectively, sectional SEM photographs of the nitride-based semiconductor element according to an eleventh embodiment of the present invention, of which FIGS. 18A and 18B show the case where an $SiO_2$ mask is formed on a GaN/sapphire substrate, while FIG. 18C shows the case where an $SiO_2$ mask is formed on an AlGaN/GaN/sapphire substrate; and FIG. 19 is a sectional view of the nitride-based semiconductor laser according to a thirteenth embodiment of the present invention.

DETAILED DESCRIPTION OF THE INVENTION

Embodiments of the present invention will now be described by reference to the drawings. Here, it should be noted that the element according to the present invention may be a light-emitting element or an electronic device so long as a nitride-based compound semiconductor is used in the element.

(First Embodiment)

Figure 1A:
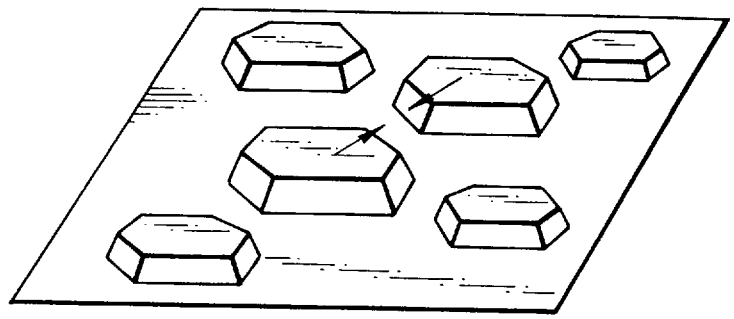
FIGS. 1A to 1C are schematic diagrams showing how a dislocation is induced when islands coalesce with each other during an island-shaped growth.
Figure 1B:
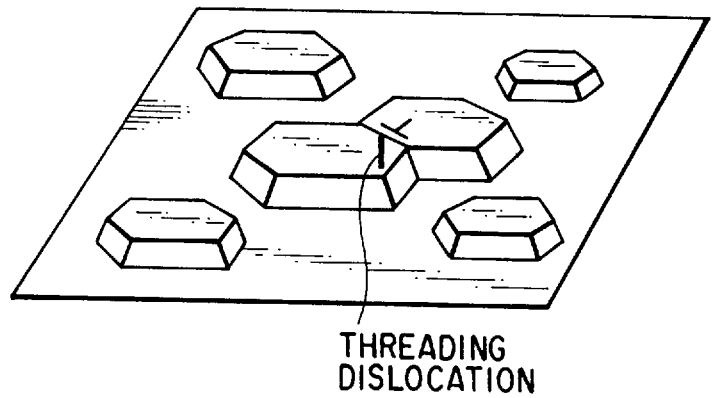
Figure 1C:
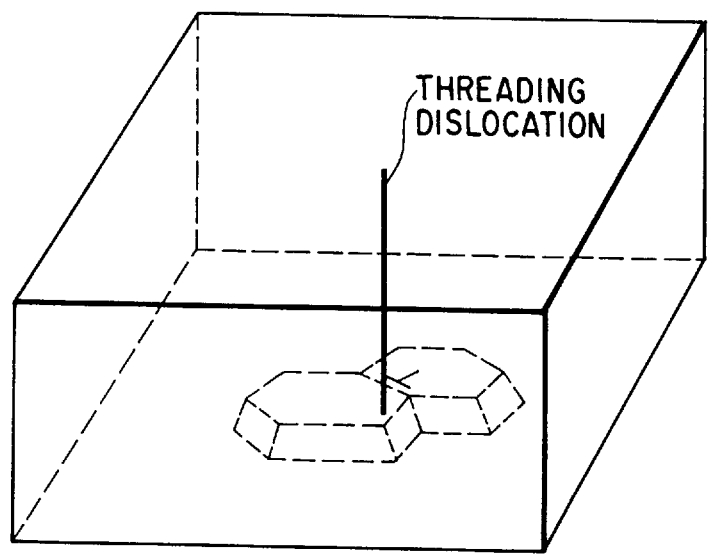
Figure 2:
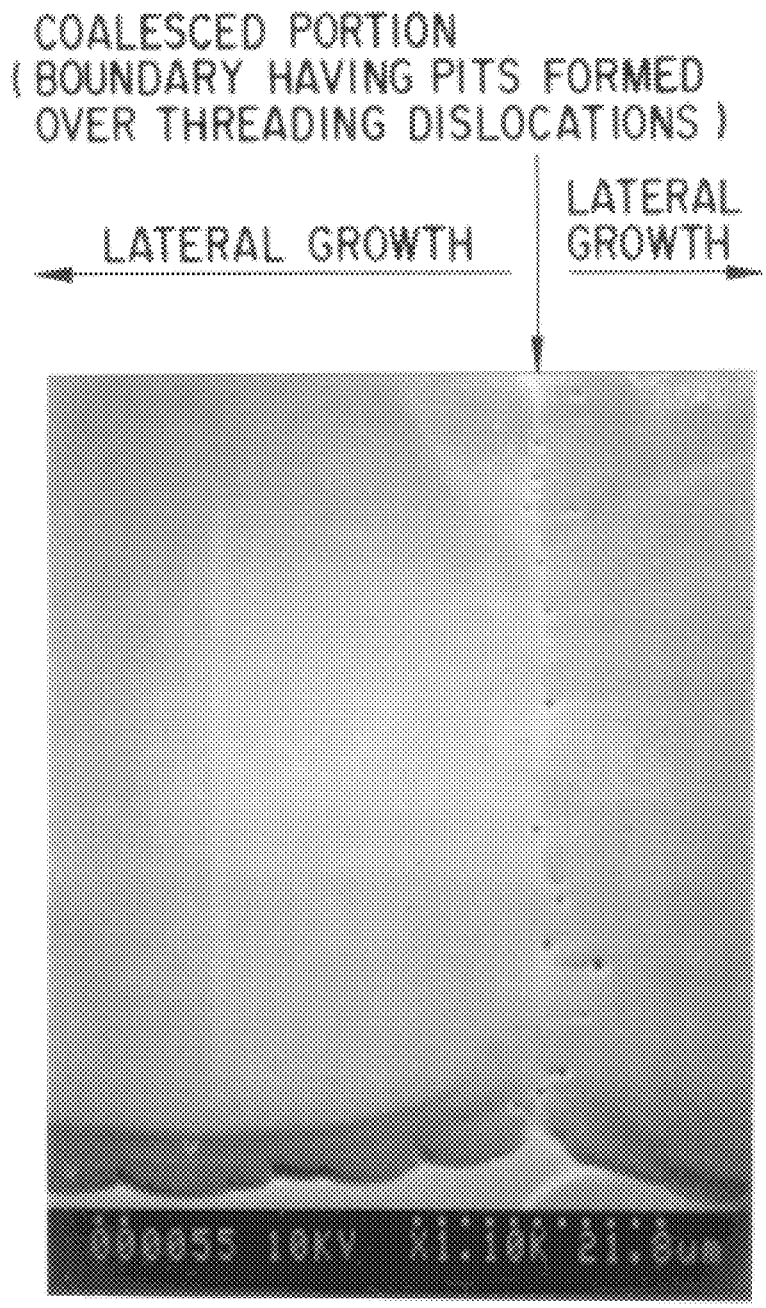
FIG. 2 is a microscopic photograph showing the pits, gaps, crack or voids formed over the threading dislocations produced in the coalescent boundary portions resulting from lateral growth.
Figure 3:
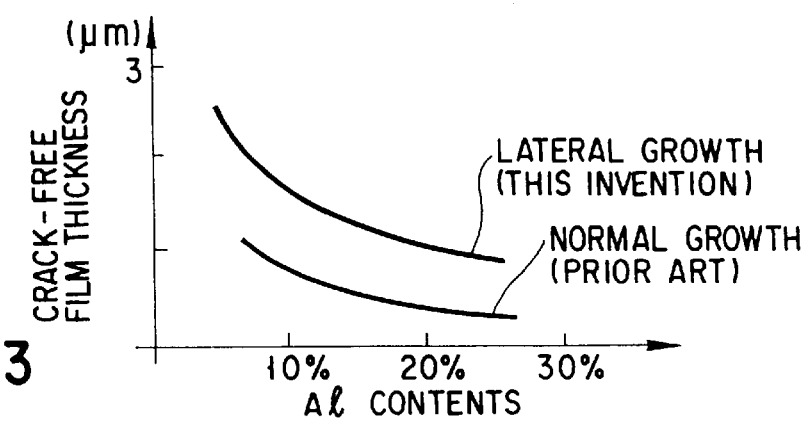
FIG. 3 is a characteristic diagram showing the relationship between the aluminum contents and the crack-free film thickness in the respective cases of the AlGaN films formed according to the present invention and the conventional method.
Figure 4:
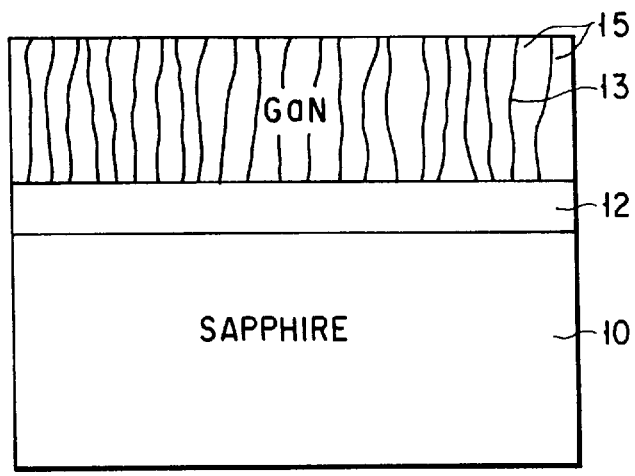
FIG. 4 is a sectional view of the nitride-based semiconductor layer fabricated by the use of the conventional method.
Figure 5:
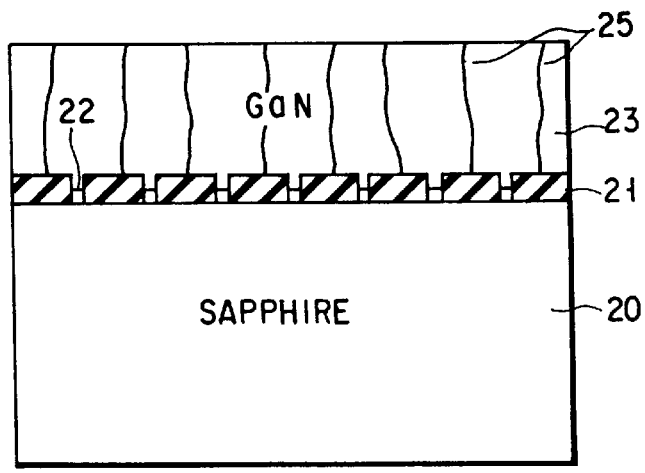
FIG. 5 is a sectional view of the nitride-based semiconductor layer according to a first embodiment of the present invention.
Figure 6:
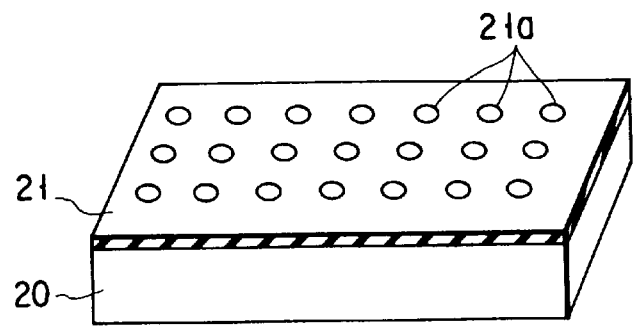
FIG. 6 is a perspective view showing the positional arrangement of the opening portions in the mask used in the first embodiment.

FIGS. 4 to 6 are schematic diagrams for explaining the structure of the nitride-based semiconductor layer according to a first embodiment of the present invention.

This embodiment will be described with reference to the case where, in accordance with a conventional method and the method of the present invention, a GaN layer is formed on a sapphire substrate having a main surface in parallel with (0001) surface by the use of the metallo-organic chemical vapor deposition (MOCVD) method. Further, the result of a comparison made, in respect of crystallability, between the GaN layers fabricated by the conventional method and the method according to the present invention will be set forth.

FIG. 4 is a partial sectional view of the nitride-based semiconductor laser manufactured by the use of the conventional method, and the conventional method will be described below.

First, on a sapphire substrate 10, a GaN buffer layer 12 is grown to a thickness of several tens of nm at a low temperature (500 to 600° C.), and thereafter, the temperature of the substrate is raised to 1000° C. or higher, and the growth of a GaN layer 13 is performed at the high temperature. In the case of the growth of this material series in accordance with the conventional method, if the growth is performed, from the beginning, at a high temperature higher than 1000° C.—at which the single crystal of GaN can be grown—without inserting a low-temperature buffer layer 12, then an island-shaped growth becomes conspicuous since the lattice mismatching is so large as about 16%, so that no flat film can be obtained. The crystal characteristics of the GaN layer 13 which has grown at a high temperature depends largely on the growth temperature, the grown film thickness, etc. of the low-temperature buffer layer 12. In this embodiment, a multi-layer film for a laser is fabricated by the use of the optimum values of the respective parameters.

Next, the method of growing a high-temperature GaN layer 13 on the sapphire substrate 10 through the GaN buffer layer 12 will be described in detail.

First, the sapphire substrate 10 treated by organic cleaning and acid cleaning is put into the reaction chamber of an MOCVD apparatus and set on a susceptor to be heated by high frequency. Next, a vapor phase etching is carried out at a temperature of 1200° C. for about 10 minutes, feeding hydrogen at normal pressure at a flow rate of 25 L/min, whereby the native oxide formed on the surface of the sapphire substrate 10 is removed.

Next, on the sapphire substrate 10, the GaN buffer layer 12 is grown, for 4 minutes, to a thickness of 40 nm at a growth temperature of 550° C. In this experiment, as the carrier gas used at the time of growth, hydrogen is fed at a flow rate of 20.5 L/min, and, as the source gas, ammonia is fed at a flow rate of 9.5 L/min, and TMG (trimethyl gallium) is fed at a flow rate of 25 cc/min. Further, after the growth of the buffer layer 12, the temperature of the substrate is raised to 1100° C. in 12 minutes, and, after the temperature of 1100° C. is reached, the GaN layer 13 is grown for one hour, as a result of which the layer is formed to a thickness of 2 μm.

Then, the high-temperature-grown GaN layer 13 thus obtained was subjected to a morphological observation, a measurement of the full width at half maximum of the rocking curve thereof by the X-ray diffractometry method, and a Hall effect measurement. As a result, it was found that the GaN layer 13 obtained was very excellent in surface flatness. The X-ray full width at half maximum of the GaN layer 13 is 3.2 arcmin, the carrier concentration was $6 \times 10^{16}$ $cm^{-3}$ (n type), and the hole mobility was 500 $cm^2/V \cdot sec$.; as a GaN layer obtained by the use of the conventional method, the crystal characteristics thereof were relatively good. Further, this same sample was observed by a transmission electron microscope (TEM) through a section thereof, as a result of which it was found that the density of threading dislocations in the high-temperature-grown GaN layer 13 was about $3 \times 10^8$ $cm^{-2}$, and thus, as a GaN layer fabricated by the conventional method, a crystal having a low dislocation density was obtained.

Next, the case where a GaN layer was fabricated by the use of the method according to the present invention will be described by reference to FIGS. 5 and 6. FIG. 5 is a partial sectional view of the nitride-based semiconductor element fabricated by the use of the method according to the present invention. The method of fabricating the element will be described below.

First, as shown in FIG. 6, on a sapphire substrate 20, there is formed a mask 21 which was composed of $SiO_2$ and has opening portions 21a each having a diameter of 2 $\mu$m and disposed at intervals of 10 $\mu$m. Subsequently, the sapphire substrate 20 with the mask 21 put thereon is put into the reaction chamber of the MOCVD apparatus as in the case of the conventional method and placed on a susceptor to be heated by high frequency power. Next, a thermal cleaning is carried out for about 10 minutes at a temperature of 1200° C., pouring hydrogen at a flow rate of 25 L/min at a normal temperature, whereby the water content and the native oxide are removed.

Subsequently, on the sapphire substrate 20 with the mask 21 formed thereon, a GaN buffer layer 22 is formed to a thickness of 20 nm by carrying out crystal growth at a growth temperature of 550° C. for 2 minutes. In this experiment, as the carrier gas at the time of growth, hydrogen is poured at a flow rate of 20.5 L/min, and, as the source gas, ammonia is poured at a flow rate of 9.5 L/min and TMG (trimethyl gallium) is poured at a flow rate of 25 cc/min. Further, after the growth of the buffer layer 22, the temperature of the substrate is raised towards 1100° C., and the feed amount of TMG is increased to a flow rate of 100 cc/min. After the temperature has reached 1100° C., a GaN layer 23 is grown, for one hour, to a thickness of 2 $\mu$m.

Subsequently, the high-temperature-grown GaN layer 23 thus obtained was subjected to a morphological observation, a measurement of the full width at half maximum of the rocking curve thereof by the X-ray diffractometry method, and a Hall effect measurement. As a result, it was found that the GaN layer 23 obtained was very excellent in surface flatness, and the X-ray full width at half maximum was 1.2 arcmin, the carrier concentration was $5 \times 10^{15}$ $cm^{-3}$ (n type), and the hole mobility was 900 $cm^2/V \cdot sec$; the crystal thus obtained was so high in quality that could not be realized by the use of the conventional method. Further, through the transmission electron microscope (TEM) observation made of this sample through a section thereof, it was found that the density of threading dislocations 25 in the high-temperature grown GaN layer 23 was reduced to about $1 \times 10^6$ $cm^{-2}$, which is about 1/100 of the threading dislocation density of the GaN layer fabricated by the conventional method.

Further, the result of the TEM observation made of the high-temperature-grown GaN layer 23 reveals that the threading dislocations 25 exist only in approximately the center portion of the $SiO_2$ mask 21, while, in the remaining portion, scarcely any crystal defect existed. This is considered to be because the opening portions 21a of the mask 21 became growth nuclei, so that, on the mask 21, a lateral growth was promoted, and, in the center portion of the mask 21, the respective islands grown from the respective opening portions 21a coalesced with one another to form dislocations.

Further, in this embodiment, the low-temperature buffer layer 22 was provided, and, on the thus formed low-temperature buffer layer 22, the high-temperature-grown GaN layer 23 was formed, but, according to the method of the present invention, in case the area of the opening portions 21a formed in the mask 21 is small as in this embodiment, a similar effect can be obtained even without provision of such a low-temperature buffer layer.

As stated above, according to this embodiment, the $SiO_2$ mask 21 having the opening portions 21a is provided on the sapphire substrate 20, so that, by the use of the opening portions 21a of the mask 21 as seeds, the low-temperature GaN buffer layer 22 and the high-temperature-grown GaN layer 23 are formed, whereby the formation of threading dislocations can be restricted only to approximately the center portion of the mask 21, and thus, the threading dislocations can be reduced as compared with the conventional method. Due to this, a nitride compound semiconductor which has excellent crystallability, electrical characteristics and optical characteristics can be formed on the sapphire substrate, and, in turn, the yield, initial characteristics and reliability of the semiconductor elements using a nitride-based compound semiconductor can be enhanced.

In this embodiment, semiconductor layers are formed by the MOCVD method. However, the hydride VPE method or the molecular beam epitaxy (MBE) method may be used instead.

(Second Embodiment)

Figure 7:
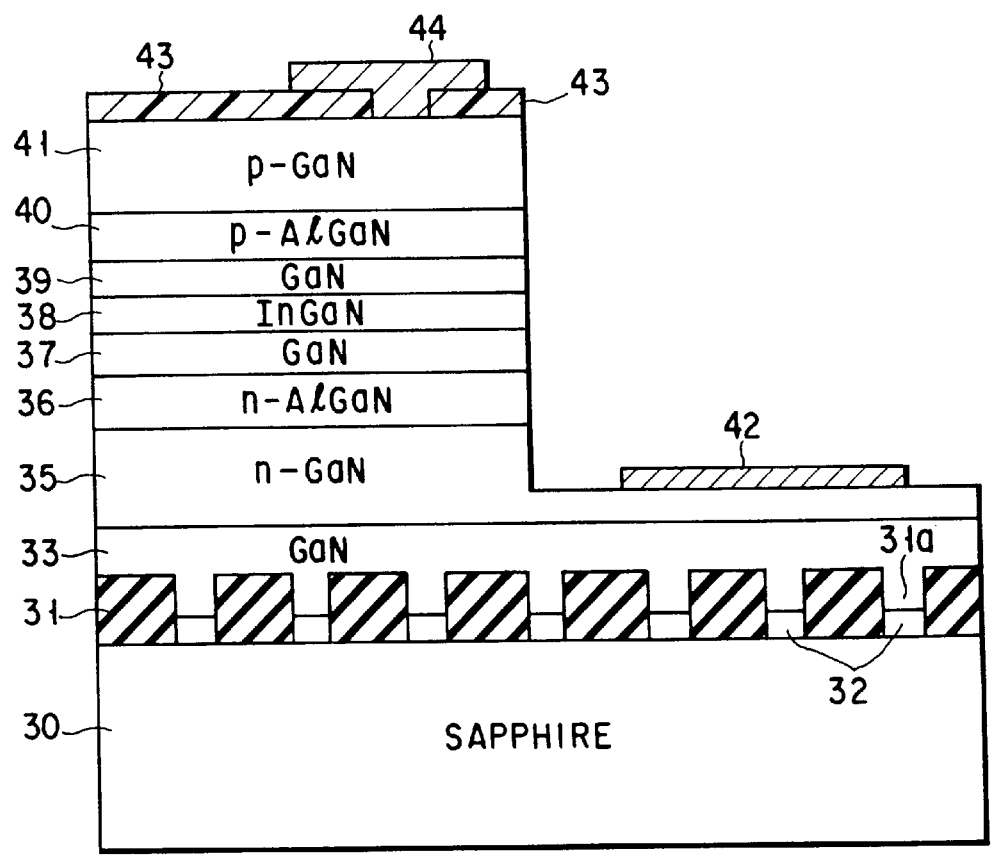
FIG. 7 is a sectional view showing the structure of the nitride-based semiconductor laser according to an embodiment of the present invention.

FIG. 7 is a sectional view showing the structure of the nitride-based semiconductor laser according to a second embodiment of the present invention.

On a sapphire substrate 30, a mask 31 composed of $SiO_2$ and having grooves 31a is formed, wherein, in the grooves 31a of the mask 31, a low-temperature GaN buffer layer 32 is formed by the use of the MOCVD method. Further, on the mask 31 and the buffer layer 32, an undoped underlying GaN layer 33 is formed by utilizing a lateral growth.

On the underlying GaN layer 33, an n-type GaN contact layer 35, an n-type AlGaN current injection layer 36, an n-type GaN optical guide layer 37, an InGaN active layer 38 having a multi-quantum well (MQW) structure, a p-side GaN optical guide layer 39, a p-type AlGaN current injection layer 40, and a p-type GaN contact layer 41 are formed in this order.

A portion of the above-mentioned multi-layer structure is removed by dry etching until the n-type GaN contact layer 35 is reached, and, on the thus exposed contact layer 35, an n-side electrode 42 is formed. Further, on the p-type GaN contact layer 41 of that portion of the multi-layer structure which has not been removed, an $SiO_2$ film 43 is selectively formed in order to narrow the current, and, on this $SiO_2$ film 43 and the p-type GaN contact layer 41, a p-side electrode 44 is formed.

Next, the method of manufacturing the semiconductor laser according to this embodiment will be described in due order. This semiconductor laser is fabricated by the use of the known metallo-organic chemical vapor deposition (MOCVD) method. The material substances used are as shown below. Used as the metallo-organic material substance is trimethylgallium (TMG), trimethylaluminum (TMA), trimethylindium (TMI), or biscyclopentadienylmagnesium) ($Cp_2Mg$); and, used as the source gas is ammonia ($NH_3$) or silane ($SiH_4$). Further, as the carrier gas, hydrogen or nitrogen are used.

Figure 8:
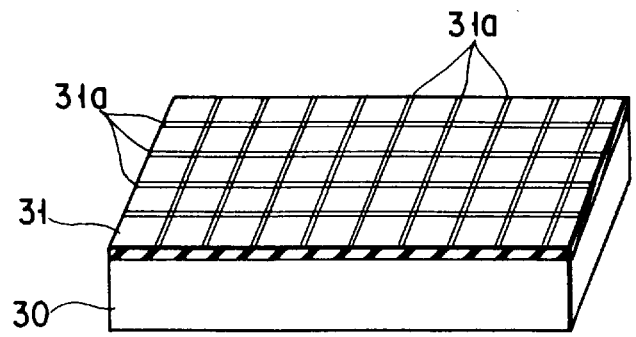
FIG. 8 is a perspective view showing the mask used in the second embodiment, the mask having grid-patterned grooves (opening portions)

First, on the sapphire substrate 30, the mask 31 is formed which is composed of $SiO_2$ and in which grooves (opening portions) 31a are provided at intervals 50 $\mu$m in a grid-shaped pattern as shown in FIG. 8. Subsequently, the mask 31 is treated by organic cleaning or acidic cleaning, and thereafter, the sapphire substrate 30 is put into the reaction furnace of an MOCVD apparatus, in which it is subjected to a thermal cleaning at 1200° C. for 10 minutes.

Subsequently, the temperature of the susceptor is raised to 500° C., so that the low-temperature-grown GaN buffer 32 is grown for three minutes. Subsequently, the susceptor temperature is raised to 1100° C.; and, after the susceptor temperature is raised to 1100°, hydrogen is fed as the carrier gas for one hour at a flow rate of 20.5 L/min, ammonia is fed for one hour at a flow rate of 9.5 L/min, and TMG is fed at a flow rate of 100 cc/min for one hour, whereby the undoped GN underlying layer 33 is formed to a thickness of 2 μm. In this case, first the grooves 31a formed in the mask 31 are filled up, and then the lateral growth is promoted on the $SiO_2$, and the respective islands grown coalesce; and, after the growth thereof for one hour, the flat undoped GaN underlying layer 33 comes to be formed.

Subsequently, 10 cc of $SiH_4$ is added, whereby the n-type GaN contact layer 35 (with a thickness of 4.0 μm) is formed in continuity. Subsequently, TMA is added at a flow rate of 60 cc/min, whereby the n-type AlGaN current injection layer 36 (with a thickness of 0.25 μm) is formed. Further, on the thus formed current injection layer 36, the GaN optical guide layer 37 is formed on the same growth condition as that of the undoped GaN underlaying layer 34.

Thereafter, the temperature of the substrate is lowered down to 740° C., and the carrier gas is changed from hydrogen over to nitrogen (at a flow rate of 20.5 L/min). In this case, the flow rate of ammonia is kept at 9.5 L/min, the flow rate of TMG is kept at 9 cc/min, and the feed amount of TMI is changed over between the flow rate of 140 cc/min and the flow rate of 30 cc/min by turns, whereby the InGaN-based active layer 38 is formed. This InGaN-based active layer 38 comprises three pairs of multi-quantum well (MQW) structures each consisting of an $In_{0.2}Ga_{0.8}N$ well layer (with a thickness of 2 nm) and an $In_{0.05}Ga_{0.95}N$ barrier layer (with a thickness of 4 nm).

After the InGaN active layer 38 is formed, the temperature of the substrate is raised to 1100° C. again. After the temperature of the substrate has reached 1100° C., the carrier gas is changed from nitrogen over to hydrogen (at a flow rate of 20.5 L/min), and the GaN optical guide layer 39, the p-type AlGaN current injection layer 40 (with a thickness of 0.25 μm) and the p-type GaN contact layer 41 (with a thickness of 0.3 μm) are formed in this order. The feed amount of $Cp_2Mg$ which is the p-type dopant material used when the p-type AlGaN current injection layer 40 is grown is set to 200 cc, and the feed amount of $Cp_2Mg$ used when the p-type GaN contact layer 41 is grown is set to 50 cc. After the growth of the p-type GaN contact layer 41, the feed of the metallo-organic material is stopped, only the nitrogen carrier gas (at a flow rate of 20.5 L/min) and ammonia (at a flow rate of 9.5 L/min) are continuously fed, and the temperature of the substrate is naturally lowered. However, the feed of ammonia is stopped when the temperature of the substrate has reached 350° C.

The multi-layer film for a nitride-based semiconductor laser fabricated by the method described above was subjected to a surface morphological observation, as a result of which it was found that the layer thus grown was very flat. Further, through a sectional transmission electron microscope (TEM) observation performed of the multi-layer film, no disturbance due to the existence of holes etc. was found in the InGaN-based active layer portion having the MQW structure, and it was confirmed that an MQW structure which had an abrupt interface and a uniform film thickness was formed. Further, the density of the threading dislocations in the multi-layer film was so low as about $6 \times 10^5$ $cm^{-2}$.

A comparison made between the above-mentioned result and the observation result obtained in the case of the multi-layer film for a laser according to the conventional method reveals that the former is markedly improved, in respect of the crystal quality, as a multi-layer film for a laser.

That is, in the multi-layer film for a laser according to the conventional method, threading dislocations exist at a high density of about $10^{10}$ $cm^{-2}$, and it is observed that there sporadically exist those portions in which the MQW structure was destroyed in, due to the existence of these dislocations, the InGaN-based active layer of the MQW structure. Further, in the grown surface of the multi-layer film for a laser fabricated by the use of the conventional method, there exist small pits (holes). Through a sectional TEM observation, it is found that, under these pits (holes), threading dislocations exist. In contrast, in accordance with this embodiment, the above-mentioned conventional drawbacks are eliminated, and thus, the crystal quality of the multi-layer film for a nitride-based semiconductor laser is markedly improved.

Further, a portion of the multi-layer structure is removed, by the use of the dry etching method, as far as the n-type GaN contact layer 35, and, on the n-type GaN contact layer 36, an n-side electrode 42 comprising Ti/Al is formed. Further, on the p-type GaN contact layer 41 of that portion of the multi-layer structure which has not been removed, an $SiO_2$ layer 43 is selectively formed for narrowing the current, and, on this $SiO_2$ layer 43 and the p-type GaN contact layer 41, a p-type electrode 44 is formed.

Next, the wafer on which the semiconductor multi-layer film having the above-mentioned electrodes was cleaved to a size of 350 μm×500 μm, whereby a resonator mirror was formed; and thus, a semiconductor laser was formed. Then, electrical current was injected into this semiconductor laser, as a result of which it was confirmed that continuous oscillation effected at a wavelength of 417 nm at room temperature. The operating voltage of the element was 4.5V, and the threshold current density was 1.5 $kA/cm^2$.

The GaN-based semiconductor laser fabricated by the use of the conventional method was poor in yield; even if GaN semiconductor lasers were fabricated under the same condition optimized, the number of those elements which oscillated was about 40%; and in addition, even if the elements oscillated, their useful life was short. Of the laser elements fabricated by the use of the conventional method, those elements which were broken after they oscillated were analyzed, as a result of which it was found that, in most of those elements, the p-side electrode material had diffused into the multi-layer film for the laser, or the magnesium (Mg) which was a p-type dopant had diffused into the active layer, the n-side current injection layer and the contact layer.

In contrast, according to this embodiment, the above-mentioned conventional drawbacks are eliminated; and the crystal quality is enhanced, whereby the initial characteristics of the laser such as the optical output when oscillation is effected are greatly improved. In addition, the yield of the elements which laser-oscillate is 80% or higher, and the useful life of the elements is lengthened to about 100 to 1000 times as long as the element fabricated by the use of the conventional method; and thus, the reliability thereof is greatly enhanced.

Although this embodiment has been described above with reference to the case it is applied to a laser, but the present invention can be applied not only to a nitride-based semiconductor laser but also to a light-emitting diode. In the case of the light-emitting diode to which the present invention is applied, the luminous uniformity and the luminous intensity of the element are markedly improved as compared with the element fabricated by the use of the conventional method; and thus, the characteristics and reliability of the element are enhanced.

(Third Embodiment)

According to this embodiment, a semiconductor laser similar to the semiconductor laser according to the second embodiment is formed on a substrate constructed in such a manner that GaN (2 μm) or GaAlN (0.3 μm)/GaN (2 μm) is grown on sapphire, First, on the above-mentioned substrate, an SiO$_2$ mask having a width of 10 μm are formed in the shape of stripes disposed at intervals 2 μm in the direction <1-100> perpendicular to the a-axis <11-20> of the GaN or GaAlN layer. Subsequently, on the substrate on which the mask has been formed, a GaN layer is grown to a thickness of 5 to 50 μm by the use of the MOCVD method. At the early stage of the growth, a lateral growth is promoted on the SiO$_2$ mask, and then, the surface flatness is improved together with the increase of the thickness of the grown film. Further, as a result of a sectional transmission electron microscope (TEM) observation made, it has been found that the dislocations which have propagated into the grown surface are decreased, and the density of the dislocations extending through in the growth direction become approximately constant.

On the substrate having a good-quality nitride-based semiconductor layer which has an improved flatness and in which the density of threading dislocations is made constant as mentioned above, a multi-layer film for a semiconductor laser similar to that according to the second embodiment is formed, and the semiconductor laser was formed in the same manner as in the case of the second embodiment. In the case of the nitride-based semiconductor laser fabricated by the above-mentioned method, the initial characteristics, the yield, and the reliability (the useful life of the element) thereof are also markedly improved as compared with those of the conventional element; and thus, the laser according to the third embodiment exhibits characteristics similar to or better than the characteristics of the laser according to the second embodiment.

Although this embodiment has been described with reference to the case where it is applied to a laser, the present invention is not only applicable to a nitride-based semiconductor laser but also to a light-emitting diode. In the light-emitting diode to which the present invention is applied, the luminous uniformity and luminous intensity of the element are substantially improved as compared with those of the element fabricated according to the conventional method; and thus, the characteristics and reliability of the light-emitting diode according to this third embodiment are more enhanced.

(Fourth Embodiment)

Figure 9:
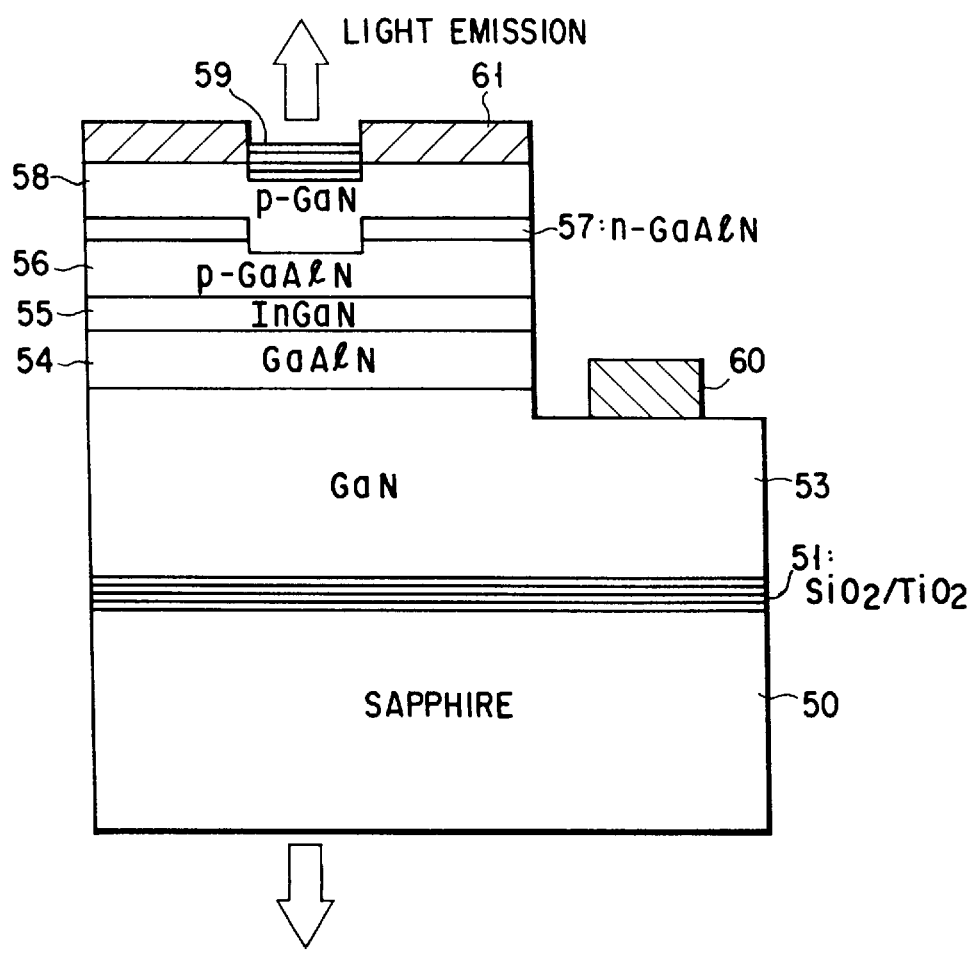
FIG. 9 is a sectional view showing the structure of the nitride-based surface-emitting laser element according to a fourth embodiment of the present invention.

FIG. 9 is a sectional view showing the structure of the surface-emitting semiconductor laser according to a fourth embodiment of the present invention.

The method for the manufacture of the semiconductor laser according to this embodiment will be described below. First, on a sapphire substrate 50, there is provided a mask 51 which is formed in such a manner that a multi-layer film composed of SiO$_2$ and TiO$_2$ are laminated by vapor deposition. In the mask 51, opening portions (not shown) each having a diameter of 0.5 μm are provided at intervals of 50 μm.

The below-described multi-layer film for the laser element is formed by the use of the MOCVD method.

On the sapphire substrate 50 on which the mask 51 has been formed, a GaN buffer layer (not shown) is grown for two minutes. Grown on the thus grown GaN buffer layer is an n-type GaN contact layer 53 (with a thickness of 2 μm) into which silicon has been doped. In this case, first the opening portions are filled up, and thereafter, the growth mode shifts to the lateral growth mode, thus forming a film with a good flatness. Subsequently grown on the film thus grown is an n-type Ga$_{0.8}$Al$_{0.2}$N current injection layer 54 into the upper portion of which silicon has been doped and which has a thickness of 0.25 μm.

Subsequently grown is an In$_{0.1}$Ga$_{0.9}$N active layer 55 which has a thickness of 0.1 μm, and, on the thus grown active layer 55, a p-type Ga$_{0.8}$Al$_{0.2}$N current injection layer 56 into the upper portion of which Mg has been doped and an n-type Ga$_{0.8}$Al$_{0.2}$N current narrowing layer 57 are successively grown in such a manner that the current injection film 56 and the current narrow layer 57 each have a thickness of 0.25 μm. Thereafter, the wafer is once removed from within the MOCVD apparatus, and, in the surface of the current narrowing layer 57, an opening portion having a diameter of 10 μmφ is formed by partial etching by the use of the photolithography technique, whereby a portion of the current injection layer 56 is exposed.

Next, the wafer is put into the MOCVD apparatus again, and, on the current narrowing layer 57, there is grown a p-type GaN contact layer 58 into which Mg has been doped. After the growth of the p-type GaN contact layer 58, the wafer is removed from within the MOCVD apparatus. Further, over approximately the whole surface of the p-type GaN contact layer 58, a multi-layer film comprising SiO$_2$ and TiO$_2$ is laminated by vapor deposition. Subsequently, by the use of the photolithography technique, the multi-layer film is processed into a predetermined shape, whereby a first reflector 59 is formed. On the other hand, the multi-layer film (mask) 51—comprising SiO$_2$ and TiO$_2$—formed on the sapphire substrate 50 is rendered into a second reflector.

A portion of the multi-layer film for the laser thus fabricated is removed by the use of the dry etching method. Further, the n-type GaN contact layer 53 is exposed to form an n-type electrode 60 thereon. On the other hand, on the p-type GaN contact layer 58, also a p-type electrode 61 is formed, forming a chip-shaped laser element separated as shown in FIG. 9.

The semiconductor laser formed as described above was mounted on a heat sink, and the element characteristics thereof were examined, as a result of which it was confirmed that a normal-temperature continuous oscillation was effected at a wavelength of 380 nm. The threshold current in this case was 95 mA, and the operating voltage was 4.6V.

In the case of the surface-emitting semiconductor laser according to this embodiment, the multi-layer film comprising SiO$_2$ and TiO$_2$ is used as a mask, whereby, at the early state of the growth of the nitride-based compound semiconductor laser, a lateral growth is promoted, whereby the crystal quality thereof is markedly enhanced. The crystal defect density of the multi-layer film for the laser thus obtained according to this embodiment is decreased to a value lower than 1/100 of that of the multi-layer film for the laser fabricated by the use of the conventional method, as a result of which the initial characteristics and reliability of the element improved.

Further, in the case of the element fabricated by the use of the conventional method, the grown layers in the wafer surface and, particularly the GaAlN layer used as the current injection layer has a marked film thickness distribution, as a result of which the reflectance is substantially reduced in the case of a surface-emitting laser; and thus, it is difficult to reduce the threshold current value. In contrast, in the case of this embodiment, this drawback is eliminated by utilizing the lateral growth of the nitride-based compound semiconductor, and thus, there can be provided a high-quality multi-layer film for a laser which has scarcely any variation in the film thickness thereof and has a low crystal defect density. In addition, the multi-layer film—comprising $SiO_2$ and $TiO_2$—used as a mask at the early stage of the growth is used as a reflector, so that a resonator with a high reflectance can be obtained, whereby the threshold current can be reduced.

(Fifth Embodiment)

Figure 10:
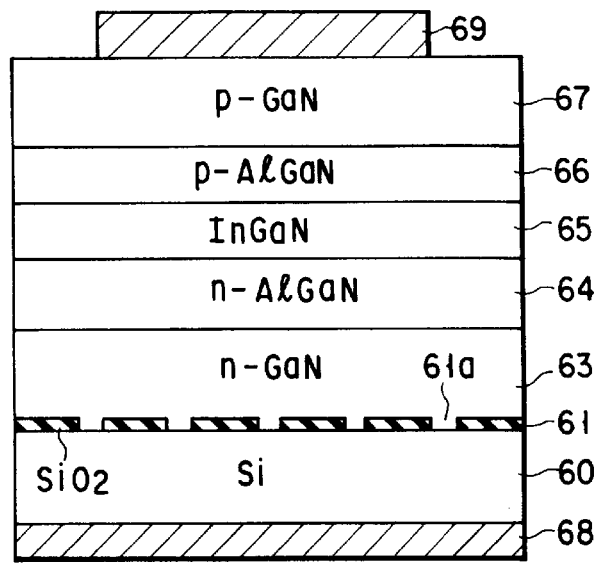
FIG. 10 is a sectional view showing the structure of the nitride-based light-emitting diode according to a fifth embodiment of the present invention.

FIG. 10 is a sectional view showing the structure of the light-emitting diode according to a fifth embodiment of the present invention.

First, on an n-type silicon substrate 60, a thermally oxidized $SiO_2$ film 61 is formed to a thickness of 100 nm in a thermal oxidation furnace. Subsequently, a resist is applied onto the $SiO_2$ film 61 and then patterned by the use of the ordinary light exposure method to form a resist mask. In this resist mask, opening portions each having a diameter of 2 μm are formed at intervals of 50 μm in a grating-shaped pattern. Subsequently, only those portions of the silicon oxide film 61 which lie under the opening portions are removed by the use of ammonium fluoride, whereby grooves 61a are formed. In this way, the silicon substrate 60 is exposed, and thereafter, the resist is removed. The substrate thus treated is put into the MOCVD apparatus, in which a thermal cleaning is carried out at about 1000° C. for ten minutes so as not to allow the evaporation of the $SiO_2$ film 61.

Subsequently, an n-type contact layer 63 is formed to a thickness of 2.0 μm, whereby there is formed a structure in which the $SiO_2$ film is embedded. Since this n-type GaN contact layer 63 is laterally grown on the $SiO_2$ film 61, it becomes a high-quality film with a small amount of dislocations even if the substrate is made of silicon. Subsequently, an n-type AlGaN current injection layer 64 with a thickness of 0.25 μm, an $In_{0.25}Ga_{0.75}N$ active layer 65 with a thickness of 0.1 μm, a p-type AlGaN current injection layer 66 with a thickness of 0.25 μm and a p-type GaN contact layer 67 with a thickness of 0.3 μm are formed in this order.

After the substrate is taken out from the MOCVD apparatus, an n-type electrode 68 is formed by vapor deposition on the rear surface of the silicon substrate 60. Further, the surface of the p-type GaN contact layer 67 is patterned by light exposure, and a p-type electrode 69 is provided by the use of the lift-off method. Finally, the activation of the p-type doped layer is effected, and an annealing is performed in a nitrogen atmosphere in order to lower the resistance of the p-type and n-type electrodes.

The light-emitting diode fabricated by the use of the method mentioned above was fed with electrical power, as a result of which the emission of an intense bluish green light was observed. The diode of this structure has the merit that it can be manufactured at a cost lower than the cost for the manufacture of the conventional light-emitting diode formed on a sapphire substrate or a SiC substrate. Moreover, the light-emitting diode fabricated by the use of the method according to this embodiment has the further merit that it can be developed into a composite element constituted in such a manner that a light-emitting element is provided on the same substrate on which various electronic devices are formed.

(Sixth Embodiment)

Figure 11:
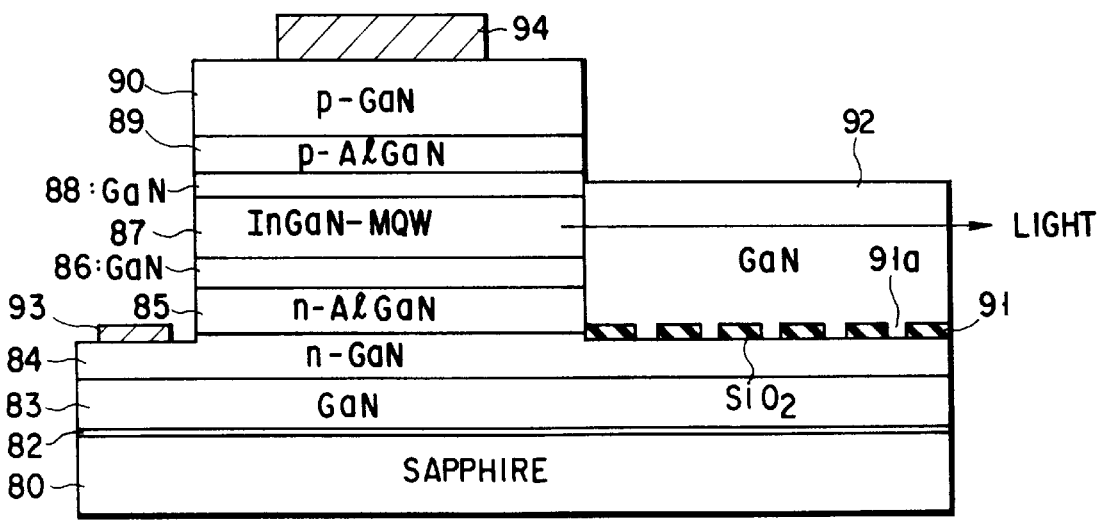
FIG. 11 is a sectional view showing the structure of the nitride-based DBR laser according to a sixth embodiment of the present invention.

FIG. 11 is a sectional view showing the structure of the distributed Bragg reflector (DBR) laser according to a sixth embodiment of the present invention.

First, a low-temperature GaN buffer layer 82 is grown on a sapphire substrate 80 by the use of the MOCVD method, and, on the thus grown buffer layer 82, an undoped GaN underlying layer 83 is grown. Subsequently, an n-type GaN contact layer 84, an n-type AlGaN current injection layer 85, an n-type GaN optical guide layer 86, an InGaN-based active layer 87 having the multi-quantum well (MQW) structure, a p-side GaN optical guide layer 88, a p-type AlGaN current injection layer 89, and a p-type GaN contact layer 90 are grown in this order, thus forming a multi-layer film necessary for the constitution of a laser.

That region of the multi-layer structure which is not used for the constitution of the laser is removed, by the use of the dry etching method, as far as the n-type GaN contact layer 84 is reached; and thereafter, an $SiO_2$ film 91 is formed to a thickness of 50 nm by the use of the CVD method using oxygen and disilane as feed gases. Subsequently, a resist suitable for electron beam exposure is applied, and, only in those portions of the resist which have been removed by dry etching, a pattern of lines each having a width of 50 nm is formed, by the use of the electron beam exposure method, in the shape of stripes disposed at intervals of 420 nm. By use of this resist as a mask, the $SiO_2$ film 91 is etched by the use of ammonium fluoride, whereby an $SiO_2$ mask 91 having linear grooves (opening portions) 91a is formed. As a result, the GaN contact layer 84 is exposed in the grooves 91a.

After this, the substrate under treatment is transferred into the MOCVD apparatus again, an undoped GaN layer 92 is re-grown to a thickness of 100 nm. This GaN layer 92 is used as a laser beam wave guide. The portion where it is not necessary to form a wave guide, which is covered by a mask while the above growth, is removed by dry etching again after the growth. The end region of the interface between the n-type GaN layer 84 and the n-type AlGaN layer 85 is etched, and, in this region, an n-side electrode 93 is formed, and, on the p-type GaN layer 90, a p-type electrode 94 is formed.

Electric current was injected into the semiconductor laser thus fabricated, as a result of which it could be confirmed that a perfectly monochromitized laser beam was radiated. On the side surface of the GaN wave guide 92, the stripe mask 91 made of $SiO_2$ and in the shape of stripes formed at a cyclic period of 420 nm exists, so that those light rays—of the light rays entering the wave guide—which have wavelengths other than 420 nm are continuously attenuated as they are repeatedly reflected. Due to this, the above-mentioned monochromatized laser beam is obtained. The wave guide comprises GaN formed by utilizing the lateral growth and thus is a high-quality layer with only a small number of defects such as dislocations.

Further, if the $SiO_2$ stripes having a cyclic period of 420 nm are formed before growing the multi-layer for the laser, then it is also possible, by the use of the same method, to fabricate, under the active layer, a distributed feedback (DFB) laser having a diffraction grating with a cyclic period of 420 nm.

In the above, the first to fifth embodiments have been described with reference to the cases where, mainly, $SiO_2$ and $TiO_2$ are used as the material of the mask, but similar effects can be obtained even if materials other than $SiO_2$ and $TiO_2$ are used so as long as they have a durability (do not react) at a temperature of 1000° C. or higher which is the growth temperature of the nitride-based compound semiconductor; as example of such mask materials, there can be pointed out $In_2O_3$, TiN, AlN, SiNx, WNx, etc. Further, metal materials such as tungsten may also be used if they have a durability at a high temperature of 1000° C. or higher.

By the use, as a mask material, of a material having a good heat dissipation such as metal material, an excellent effect can be obtained in respect of the following point besides the improvement in the element characteristics resulting from the enhancement in the crystal quality: In the case of a semiconductor element requiring the injection of a high current or a high voltage, there arises the serious problem that the reliability of the element is deteriorated due to the rise of the temperature of the element. In the case of such an element, a metal having a good heat dissipation is used as a mask for promoting the lateral growth, whereby the reliability is markedly enhanced.

Further, there can also be obtained a merit by using, as the mask material, a material which has a poor heat conduction. For instance, in the case of an element which has such a problem that the carriers excited are small in amount, a material which has a poor heat conduction is used as the material of the mask, so that the temperature is intentionally raised to promote the excitation of carriers, whereby there can be obtained the effect that the element voltage can be lowered.

As described above, by the selection of a mask material which makes the best use of the characteristics of the element, there can be obtained not only the effect the crystal characteristic is improved, which results, in turn, in an improvement in the characteristics of the element, but various other effects can also be obtained.

Further, in the above-described embodiments, sapphire and silicon substrates are used by way of example, but, besides these, a SiC substrate, an $MgAl_2O_4$ substrate, etc. can also be used.

Further, the present invention can be applied not only to light-emitting elements each using a nitride-based compound semiconductor but also to electronic devices. In particular, in the case of applying the present invention to electronic devices, the density of crystal defects such as threading dislocations etc is lowered, whereby the crystallability thereof is enhanced, as a result of which, for instance, the mobility of the carriers is substantially increased, thus improving the electric characteristics of the devices as well as the element characteristics thereof.

(Seventh Embodiment)

Figure 12:
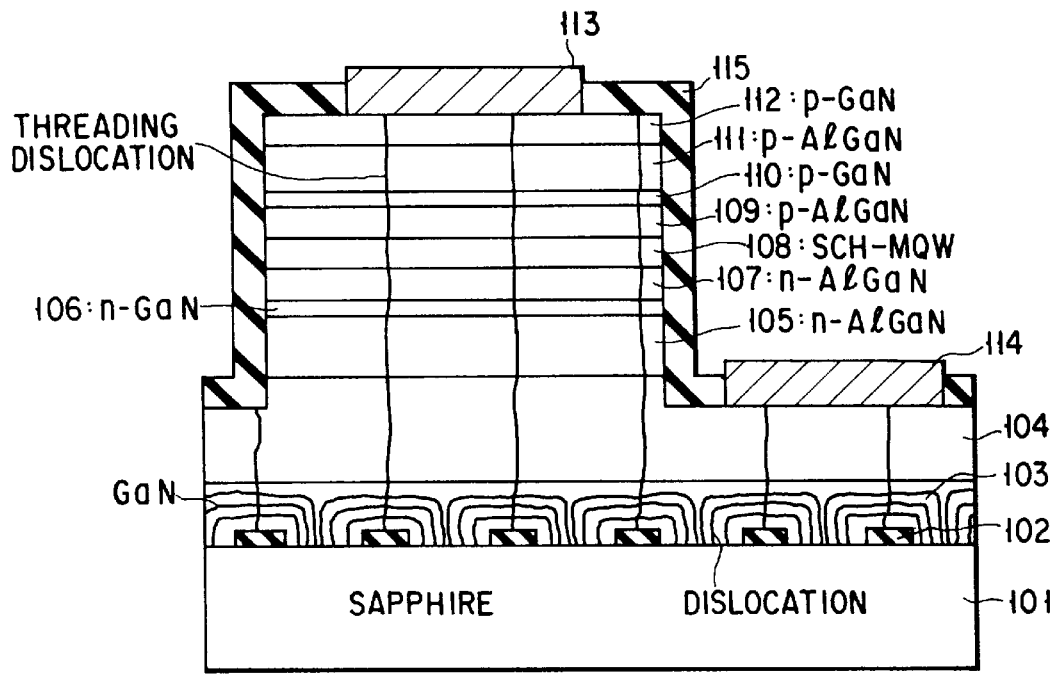
FIG. 12 is a sectional view showing the structure of nitride-based semiconductor laser according to a seventh embodiment of the present invention.
Figures 13A, 13B:
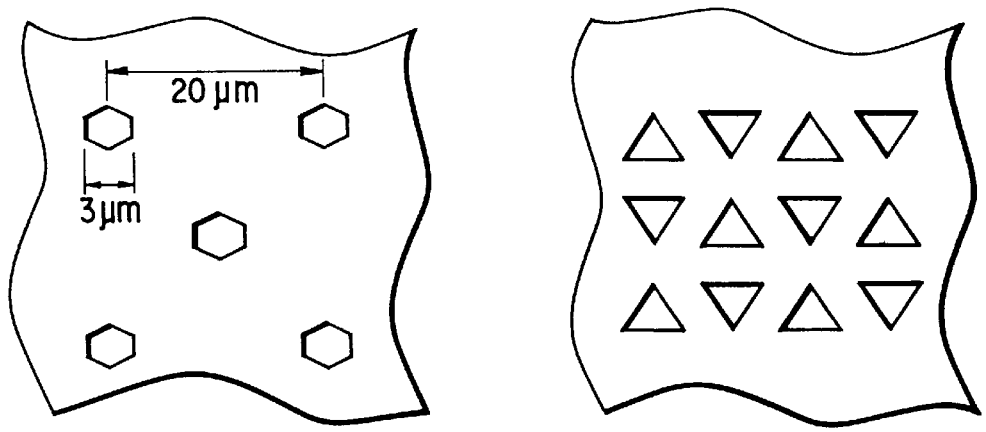
FIGS. 13A and 13B are, respectively, plan views showing examples of the mask pattern used in the seventh embodiment.

FIGS. 12, 13A and 13B are, respectively, schematic diagrams for explaining the nitride-based semiconductor laser according to a seventh embodiment of the present invention, of which FIG. 12 is a sectional view showing the structure of the nitride-based semiconductor laser, and FIGS. 13A and 13B are plan views showing mask patterns, respectively.

Referring to FIG. 12, the reference numeral 101 denotes a sapphire substrate, numeral 102 denotes an $SiO_2$ layer (with a thickness of 0.3 $\mu$m) as a mask, numeral 103 denotes an undoped GaN layer (with a thickness of 3 $\mu$m), numeral 104 denotes an n-type GaN contact layer (doped with silicon, $5 \times 10^{18}$ cm$^{-3}$, 3 $\mu$m), numeral 105 denotes an n-type $Al_{0.08}Ga_{0.92}N$ clad layer (silicon doped, $1 \times 10^{18}$ cm$^{-3}$, 0.8 $\mu$m), numeral 106 denotes an n-type GaN wave guide (silicon doped, a thickness of 0.1 $\mu$m), numeral 107 denotes an n-type $Al_{0.2}Ga_{0.8}N$ carrier overflow prevention layer (silicon doped, $1 \times 10^{18}$ cm$^{-3}$, 20 nm), and numeral 108 denotes an active layer. The active layer 108 is of a quantum well structure (SCH-MQW: Separate Confinement Heterostructure Multi-Quantum Well) comprising five InGaN quantum well (undoped, $In_{0.2}Ga_{0.8}N$, 3 nm) layers and InGaN barrier layers (undoped, $In_{0.05}Ga_{0.95}N$, 6 nm) sandwiching the 5 InGaN quantum well layers well layers therebetween.

Numeral 109 denotes a p-type $Al_{0.2}Ga_{0.8}N$ carrier overflow prevention layer (magnesium doped, $1 \times 10^{18}$ cm$^{-3}$, 20 nm), numeral 110 denotes a p-type GaN wave guide (magnesium doped, 1 $\mu$m), numeral 111 denotes p-type $Al_{0.08}Ga_{0.02}N$ clad layer (magnesium doped, $1 \times 10^{18}$ cm$^{-3}$, 0.8 $\mu$m), numeral 112 denotes a p-type GaN contact layer (magnesium doped, $1 \times 10^{18}$ cm$^{-3}$, 0.8 $\mu$m), numeral 113 denotes p-side electrode comprising a Pt (10 nm)/Ti (20 nm)/Pt (30 nm)/Au (1 $\mu$m) structure, numeral 114 denotes an n-side electrode comprising an Al/Ti/Au structure, and numeral 115 denotes an $SiO_2$ insulating film. Further, through not shown particularly in the drawing, on the laser beam radiating end face (parallel to the paper surface), a high-reflection coating comprising many $TiO_2/SiO_2$ layers laminated is provided.

The method for the manufacture of the structure shown in FIG. 12 is carried out as follows: First, on the sapphire substrate 10, there is formed a mask constituted in such a manner that, as shown in FIG. 13A, hexagonal opening portions are formed in an $SiO_2$ layer 102 formed by the use of CVD method. The ratio between the cyclic period and size of this $SiO_2$ mask is set to a value lower than 1% of the lattice mismatch between the sapphire substrate 101 and the undoped GaN 103, and the respective sides are made parallel to the <1-100> directions of the undoped GaN 103.

Next, the temperature is raised up to 1200° C. in a nitrogen atmosphere to perform a heat treatment both for the thermal cleaning of the substrate and the cleaning of the $SiO_2$ mask 102. Thereafter, the temperature is lowered down to 500° C., GaN is grown for 3 minutes by the use of the known MOCVD method, feeding trimethylgallium, ammonia gas and a carrier gas. Subsequently, the temperature is raised to 1100° C., and the undoped GaN layer 103 is grown for one hour. In this process, first, in the opening portions of the mask, GaN grows randomly at 500° C., but when the temperature is raised to 1100° C., GaN is formed into the shape of a hexagonal pyramid. Subsequently, lateral growth proceeds in three directions, and, after one hour, a flat undoped GaN layer 103 is formed.

To put it in more detail, the dislocations which have started from the surface of the sapphire substrate 101 exposed to the opening portions of the mask 102 propagate in the lateral direction along the surface of the mask 102 and, at the middle parts of the respective light screening portions of the mask, coalesce with the dislocations propagating from the opposite direction, thus forming threading dislocations. As the GaN layer 103 is growing, the threading dislocations extend upwards, but the dislocations formed in the lateral directions gradually become less and less; and no dislocation other than the threading dislocations ceases to exist in the regions having thicknesses greater than a certain thickness value. In other words, in each of those regions of the GaN layer 103 which have thicknesses greater than a certain thickness value, an area in which dislocations exist and an area where no dislocation exists co-exist even on the light screening portions of the mask 102.

Further, in the $SiO_2$ layer 102 formed by the use of the CVD method, an incomplete product of silicon having a hydrogen group exists randomly. Due to this, unless an annealing is carried out at a high temperature higher than the crystal growth temperature of the nitride-based semiconductor, the nitride-based semiconductor having the $SiN_x$ layer as a nucleus comes to grow irregularly also on the $SiO_2$ layer 102.

Next, without exposing the substrate to the atmospheric air, the n-type GaN contact layer 104, the n-type AlGaNclad layer 105, the n-type GaN wave guide 106, the n-$Al_{0.2}Ga_{0.8}N$ carrier overflow prevention layer 107, the MQW active layer 108, the p-type $Al_{0.2}Ga_{0.8}N$ carrier overflow prevention layer 109, the p-type GaN wave guide 110, the p-type $Al_{0.08}Ga_{0.02}N$ clad layer 111, and the p-type GaN contact layer 112 are formed in this order.

Subsequently, a portion of the above-mentioned multi-layer structure is removed, by the use of the dry etching method, as far as the surface of the n-type GaN contact layer 104, thus forming a mesa, and, on the thus exposed surface of the n-type GaN contact layer 104, an n-side electrode 114 is formed. Further, on the p-type GaN contact layer 112, which is the top portion of the mesa, a stripe-shaped p-side electrode 113 is formed. In this case, the exposed surface of the nitride-based semiconductor is in a state covered with the $SiO_2$ layer 115.

The multi-layer film for the nitride-based semiconductor laser fabricated by the use of the above-mentioned method was subjected to a surface morphological observation, as a result of which it was found that a very flat grown layer had been formed. Further, a sectional transmission electron microscopic (TEM) observation was made, as a result of which it could be confirmed that an MQW structure having a sharp interface and a flat and uniform film thickness had been formed. Further, the density of dislocations in the multi-layer film was so low as about $10^5$ cm$^{-2}$.

Next, the wafer on which the above-mentioned semiconductor multi-layer film was formed was rendered into chips so that the resonator length could become 250 μm, and thus, semiconductor lasers were fabricated. Electric current was injected into these semiconductor lasers, as a result of which it was confirmed that room-temperature continuous oscillation was effected at wavelengths of from 415 to 417 nm. The operating voltage of each element was 4.8V±0.3V, the threshold current density thereof was 1.5 to 1.8 kA/cm². Further, it was confirmed that, in elements more than 97% of all the elements in the wafer, the room-temperature continuous oscillation continuing for more than 10000 hours was effected. On the other hand, in case semiconductor lasers of the same structure were fabricated without performing lateral growth, the density of threading dislocations in the respective multi-layer film was so high as about $10^{11}$ cm$^{-2}$, the operating voltage and the threshold current density of the element were so large in dispersion that the operating voltage of the element ranged over 6.2V±1.5V, and the threshold current density thereof ranged over 2 to 5 kA/cm², and the room-temperature continuous oscillation operation was less than 500 hours.

As is clear from the above, according to this embodiment, the $SiO_2$ mask 102 which has a pattern of hexagonal opening portions is formed on the sapphire substrate 101, and, on this mask, the GaN layer 103 is formed by utilizing the lateral growth, whereby the high-quality GaN layer 103 which has less defects such as threading dislocations etc. can be formed. Therefore, not only the initial characteristics of the laser such as, e.g. the optical output when the laser oscillates are markedly improved, but also the reliability and the yield can be enhanced.

In this embodiment, the $SiO_2$ mask 102 having a pattern of hexagonal opening portions is used as shown in FIG. 13A, but, even in case a mask which has a pattern of triangular opening portions as shown in FIG. 13B was used, the same effect could be obtained. Further, in case the hexagonal opening pattern shown in FIG. 13A were used as $SiO_2$ islands, and in case the triangular opening pattern shown in FIG. 13B were used as islands, the same effect was obtained.

(Eighth Embodiment)

Figure 14:
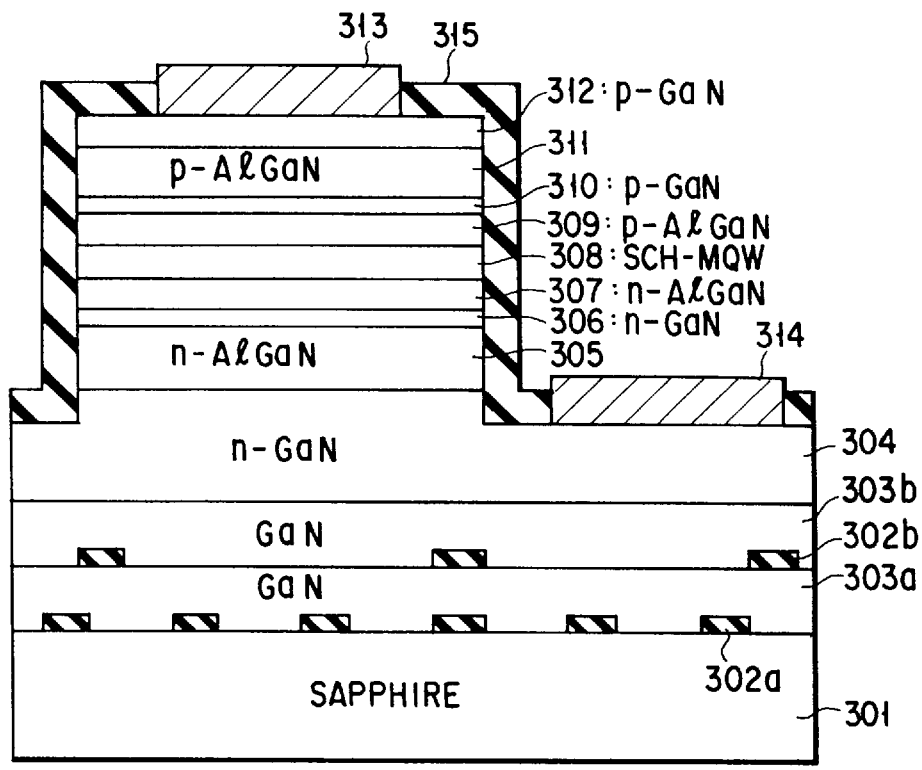
FIG. 14 is a sectional view showing the structure of the nitride-based semiconductor laser according to an eighth embodiment of the present invention.

FIG. 14 is a sectional view showing the structure of the nitride-based semiconductor laser according to an eighth embodiment of the present invention. The layers denoted by the reference numerals 301 to 315 shown in FIG. 14 correspond to the layers denoted by numerals 101 to 115 in FIG. 12.

On a sapphire substrate 301, an $SiO_2$ layer 302a is formed to a thickness of 0.3 μm as a first mask, and, on the $SiO_2$ layer 302a, an undoped GaN layer 303a is formed to a thickness of 3 μm. On the GaN layer 303a, an $SiO_2$ layer 302b is formed to a thickness of 0.3 μm as a second mask, and, on the $SiO_2$ layer 302b, an undoped GaN layer 303b is formed to a thickness of 3 μm.

Further, on the GaN layer 303b, an n-type GaN contact layer 304, an n-type $Al_{0.08}Ga_{0.92}N$ clad layer 305, an n-type GaN wave guide layer 306, an n-type $Al_{0.2}Ga_{0.8}N$ carrier overflow prevention layer 307, a SCH-MQW active layer 308, a p-type $A_{0.2}Ga_{0.8}N$ carrier overflow prevention layer 309, a p-type GaN wave guide layer 310, a p-type $Al_{0.08}G_{0.02}N$ clad layer 311, a p-type GaN contact layer 312, a p-side electrode 313, an n-side electrode 314, and an $SiO_2$ insulating film 315 are formed as in the case of the foregoing seventh embodiment.

This embodiment differs from the foregoing seventh embodiment in that, in the former, the lateral growth utilizing the $SiO_2$ mask is carried out twice. Accordingly, only the manufacturing step constituting this point of difference will be described below, omitting the description on the formation step of the n-type GaN contact layer 304 and the formations steps following the step 403.

First, on the sapphire substrate 301, there is formed a mask constituted in such a manner that hexagonal opening portions are provided in the $SiO_2$ film 302a formed by the use of the CVD method. The ratio between the cyclic period and the size of this $SiO_2$ mask is set to 1% or less of the rate of lattice mismatch between the sapphire substrate 301 and the undoped GaN layer 303a, and the respective sides are made parallel to the <1-100> directions of the undoped GaN 303a as in the case of foregoing seventh embodiment.

Subsequently, the temperature is raised up to 1200° C. in a nitrogen atmosphere to perform a heat treatment both for the thermal cleaning of the substrate and for the annealing of the $SiO_2$ mask 302a. Thereafter, the temperature is lowered down to 500° C., and the GaN layer is grown for 3 minutes by the use of the known MOCVD method, feeding trimethylgallium and ammonia gas as well as a carrier gas. Subsequently, the temperature is raised to 1100° C., and the undoped GaN layer 303a is grown for one hour.

Next, the $SiO_2$ film 302b is formed again by the use of the CVD method, and a stripe-shaped mask having a width of 3 μm and a cyclic period 20 μm is formed in parallel to the <1-100> direction of the undoped GaN 303a. Subsequently, the temperature is raised up to 1200° C. in a nitrogen atmosphere to perform a heat treatment both for the thermal cleaning of the substrate and for the annealing of the $SiO_2$ mask 302b. Thereafter, the temperature is lowered down to 1100° C., and trimethylgallium and ammonia gas as well as a carrier gas are fed, and thus, the undoped GaN layer 303b is grown for one hour.

Subsequently, the n-type GaN contact layer 304 and the other layers to follow are formed without exposing them to the atmospheric air. In this case, by setting the longitudinal direction of the laser resonator so as to be parallel to the stripes of the $SiO_2$ mask 302b, the probability of threading dislocations being produced in the resonator is substantially reduced, and thus, the element characteristics can be enhanced.

The multi-layer film for the nitride-based semiconductor laser was actually subjected to a TEM observation, as a result of which it was found that the density of threading dislocations could be reduced to about $10^5$ cm$^{-2}$ in the undoped layer GaN layer 303a and to about $10^3$ cm$^{-2}$ in the multi-layer portion above the undoped layer 303b.

Next, the wafer on which the semiconductor multi-layer film having the above-mentioned electrodes is made into chips so that the resonator length may become 250 μm, and thus, semiconductor lasers were fabricated. Electric current was injected into these semiconductor lasers, as a result of which it was confirmed that room-temperature continuous oscillations were effected at wavelengths of from 415 to 417 nm. The operating voltages of the elements were 4.8V±0.2V, the threshold value current densities thereof were 1.5 to 1.6 kA/cm$^2$. Further, it was confirmed that, in elements corresponding, in number, to 99% or more of all the elements in the wafer, room-temperature continuous oscillations were effected.

As stated above, according to this embodiment, by performing the lateral growth twice, the threading dislocations can be further reduced than in the case of the seventh embodiment, and not only the initial characteristics of the laser such as, e.g. the optical output when oscillation is effected, are substantially improved, but also the reliability and the yield of the laser can be enhanced.

Although, in this embodiment, the SiO$_2$ mask which has a pattern of hexagonal opening portions as shown in FIG. 13A, but the pattern of triangular opening portions shown in FIG. 13B may alternatively be used, and further, a combination of hexagonal island-shaped pattern and triangular island-shaped pattern can also be used so long as the lowermost SiO$_2$ mask (302a) has a hexagonal or triangular opening pattern. Further, in this embodiment, the lateral growth are carried out twice, but it is a matter of course that, by repeating the lateral growth a larger number of times, the density of threading dislocations can be more reduced.

The foregoing seventh and eighth embodiments have been describe with reference to the cases where, as the material of the mask used for promoting the lateral growth, mainly SiO$_2$ is used, but, besides this, any other material having a durability at a temperature higher than 1000° C. which is the growth temperature of the nitride-based semiconductor can be used to obtain the same effect. For instance, TiO$_2$, In$_2$O$_3$, TiN, SiN, WNx, etc. are pointed out such materials. Further, metal materials such as tungsten can also be used if they have a durability at a temperature of 1000° C. or higher. Moreover, in the foregoing embodiments, a sapphire substrate is used by way of example, but, besides this, a substrate composed of Si, SiC, ZnO, MgAl$_2$O$_4$ or the like can also be used.

Further, the present invention can be applied not only to nitride-based semiconductor lasers but also to light-emitting diodes, light-sensitive elements, and electronic devices; the density of the crystal defects such as threading dislocations etc. can be reduced, as a result of which the crystallability is enhanced. In particular, in the case of a light-sensitive element which needs to be fed with a high voltage, the behavior of the dislocations is restricted due to the reduction of the threading dislocations, and thus, the reliability thereof is enhanced. In particular, in the case of an electronic device, the carrier mobility is substantially increased, whereby the characteristic and reliability thereof are improved.

(Ninth Embodiment)

Figure 15:
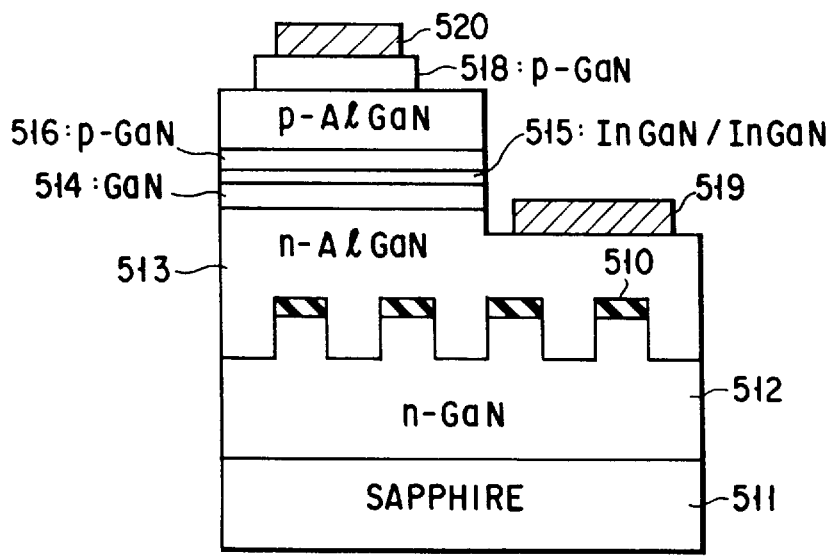
FIG. 15 is a sectional view showing the structure of the nitride-based semiconductor laser according to a ninth embodiment of the present invention.

FIG. 15 is a sectional view showing the structure of the nitride-based semiconductor laser according to a ninth embodiment of the present invention.

Referring to FIG. 15, numeral 511 denotes a sapphire substrate, and, on the sapphire substrate 511, an n-type GaN buffer layer 512 is formed. On the GaN buffer layer 512, an SiO$_2$ mask 510 is provided in the form of stripes. By the use of this mask 510, the buffer layer 512 is etched down to a predetermined depth. On the GaN buffer layer 512 and the SiO$_2$ mask 510, an n-type AlGaN clad layer 513 is formed flat by utilizing the lateral growth, and, on the clad layer 513, an undoped GaN optical guide layer 514, a quantum well layer 515 consisting of an InGaN/InGaN, a p-type GaN optical guide layer 516, and a p-type AlGaN clad layer 517 are formed.

Further, a portion of the above-mentioned laminate or stack structure is removed from the surface side thereof down to the clad layer 513, and, on the clad layer 513 thus exposed, an n-side electrode 519 is formed. On the p-type AlGaN clad layer 517, a p-side electrode 520 is formed through a low-resistance p-type GaN contact layer 518. These electrodes 519 and 520 are each narrowed to a width of 3 μm.

Here, it is pointed out that, for the growth of the respective layers, the MOCVD method is used. Further, in order to form a hetero junction of a GaN (512)/AlGaN (513) having a stepped structure, an SiO$_2$ which will be used as a mask after the growth of the n-type GaN layer 512 is formed by sputtering, and thereafter, patterning is carried out so that the width of one thereof may become 2 μm. In this case, a portion of the n-type GaN layer 512 is also etched. Thereafter, an ordinary crystal growth is performed. In this embodiment, the substrate side is set as the n type, but this embodiment can also be applied to the case where, conversely, the substrate side is set as the p type. In this case, on the p-type GaN layer, a mask material such as SiO$_2$ is provided.

In the structure of this embodiment, an SiO$_2$ mask is formed in a portion of the hetero junction which has a stepped structure, and, on the SiO$_2$ mask, a crystal growth is effected by utilizing the lateral growth, whereby the n-type AlGaN clad layer 513 can be formed thick without causing the occurrence of cracks, and thus, no light can leak out from the clad layer 513. Due to this, the electromagnetic wave distribution of the light comes to spread centering around the active layer, whereby the optical confinement is greatly improved. Thus, a semiconductor laser having a low oscillation threshold value with a stabilized mode can be realized. In this connection, it is pointed out that the threshold value of the semiconductor laser having the structure according to this embodiment is 1 kA/cm$^2$, which is lower than ⅕ of the threshold value of the conventional semiconductor laser.

(Tenth Embodiment)

Figure 16A:
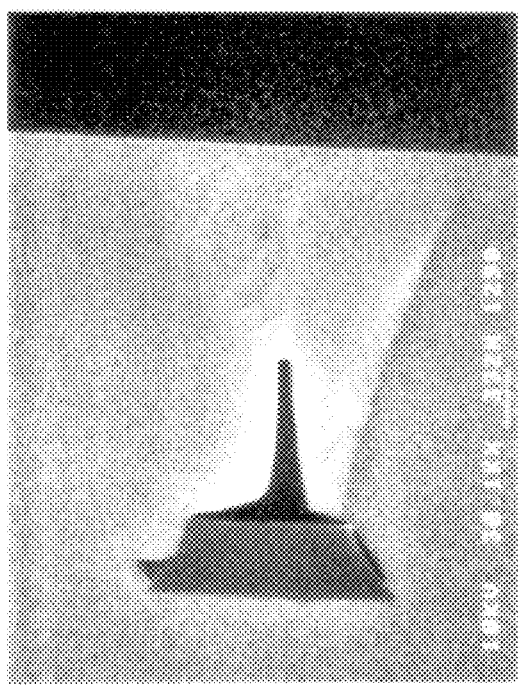

A tenth embodiment is constituted in such a manner that the direction in which the stripe-shaped SiO$_2$ mask is formed is changed. FIG. 16A shows the result of the lateral growth characteristics actually examined. The growth of GaN was carried out by the use of the metallo-organic vapor growth (MOCVD) method. FIG. 16A shows an example of the case where, on the sapphire substrate, the GaN layer is grown to about 2.5 μm, and, on the GaN layer, a stripe-shaped SiO$_2$ mask whose stripes each have a width of about 2.5 μm are formed at intervals of about 3 μm in the <11-20> direction of the sapphire substrate, that is, the <1-100> direction of the GaN.

Figure 16B:
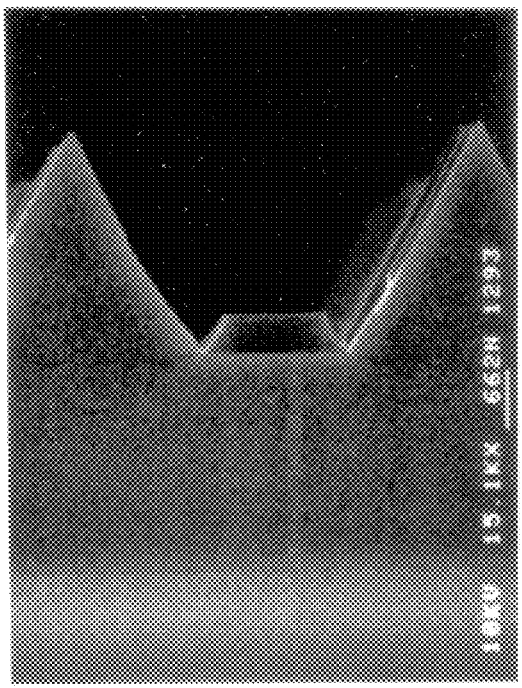

FIG. 16B shows an example of the case where, on the sapphire substrate on which GaN is grown to a thickness of about 2.5 μm as in the above-mentioned case, there is provided a stripe-shaped SiO$_2$ mask whose stripes each having a width of about 1.5 μm are formed at intervals of about 3 μm in the direction differing by 90° from the direction in the case of FIG. 16A, that is, the <1-100> direction of the sapphire substrate or the <11-20> direction of the GaN. FIGS. 16A and 16B are the photographs obtained by observing the sample from a section thereof by means of a scanning electron microscope (SEM).

In the case of FIG. 16A, it is understood that, in the portion in which the SiO$_2$ mask does not exist, the growth of the GaN layer proceeds by inheriting the information of the underlying layer, and, in the portion in which the SiO$_2$ mask exists, the lateral growth is promoted from both ends of the mask, and, at the center of the mask, the GaN layers coalesce with each other; and, as the growth further goes on, the GaN layer is flattened.

On the other hand, in the case of FIG. 16B, in the portion in which the SiO$_2$ mask does not exist, the growth goes on, so that ridge-shaped islands of triangular section are formed in parallel to the stripes of the mask, but in the portion in which the mask exists, the growth does not go on.

Figure 17A:
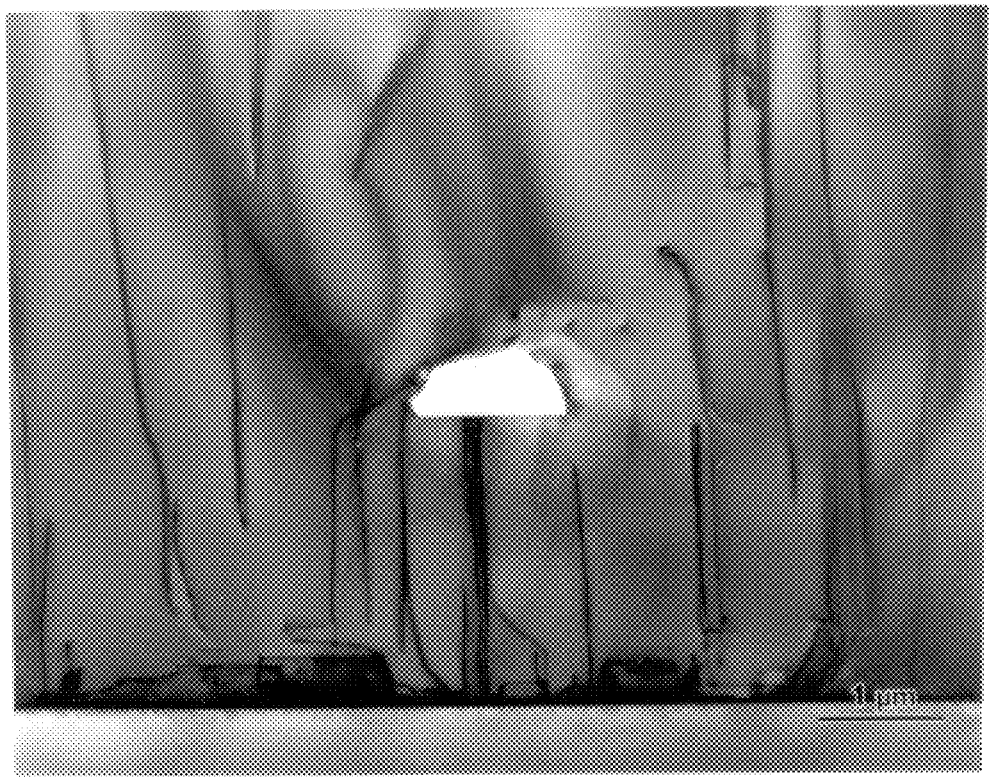
FIGS. 17A and 17B are, respectively, sectional TEM photographs of the samples shown in FIG. 16A.
Figure 17B:
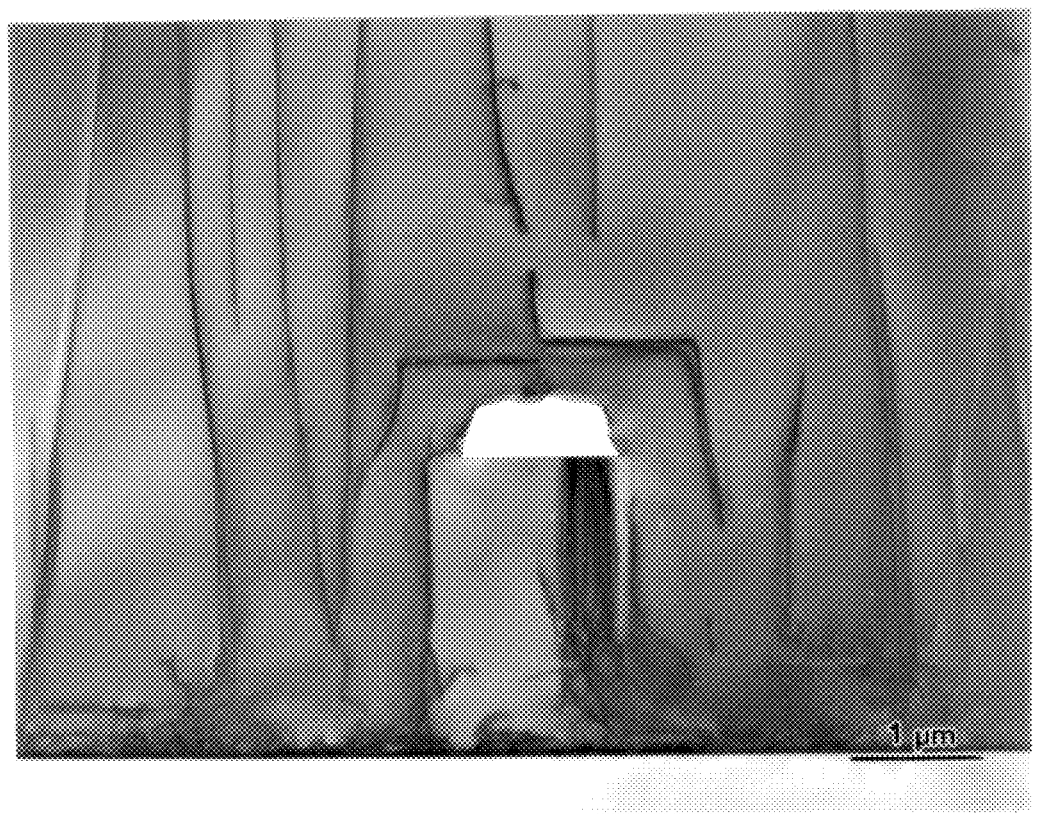

From the results mentioned above, it becomes clear that, in the case of using the MOCVD method, the stripe-shaped mask should desirably be formed in the <11-20> direction of the sapphire substrate, that is, the <1-100> direction of the GaN. FIGS. 17A and 17B show cross-sectional transmission electron microscope images of a sample formed in such a manner that the stripe-shaped SiO$_2$ mask is formed in the <11-20> direction of the sapphire substrate, that is, the <1-100> direction of the GaN. The threading dislocations produced in the interface between the sapphire substrate and the GaN layer extend through the layer in the growth direction in the portion thereof in which the mask does not exist; and the density of dislocations is not increased even by increasing the film thickness.

On the other hand, in the portion in which the mask exists, the threading dislocations which existed under the mask are blocked by the existence of the mask, and thus, the propagation thereof towards the upper portion is suppressed. However, the lateral growths of the GaN from both ends of the mask proceed, and they coalesce with each other in the middle portion of the mask ordinarily, whereby threading dislocations are formed.

Further, as for the threading dislocations which exist around the mask, their propagation direction is bent, due to the existence of the mask, from the growth direction into the growth surface perpendicular to the growth direction. Accordingly, at the early stage of the lateral growth, many dislocations propagating along the growth surface exist, but, by growing the GaN layer by about 2 μm, the density of dislocations propagating along the growth surface can be substantially reduced, and thus, only the threading dislocations propagating in the growth direction come to exist.

That is, the threading dislocations propagate, as in the case of the conventional structure, in the growth direction in the portion spaced part from the mask, but, in the portion ranging from upon the mask to the area therearound, the density of dislocations can be substantially reduced. Due to the above, the direction in which the lateral growth is promoted, and a flat GaN film can be obtained is selected, the area of the mask is increased, and further, the intervals between the stripes of the mask is narrowed, whereby the density of threading dislocations can be greatly reduced.

(Eleventh Embodiment)

In the case of an eleventh embodiment, there are shown the comparing two results obtained by examining the lateral growth characteristics with reference to the case where GaN is used as the underlying substrate for forming the mask made of SiO$_2$ or the like, and the case where AlGaN is used as the underlying substrate. The growth of GaN is performed by the use of the metallo-organic vapor growth (MOCVD) method as in the case of the foregoing embodiment.

Figure 18A:
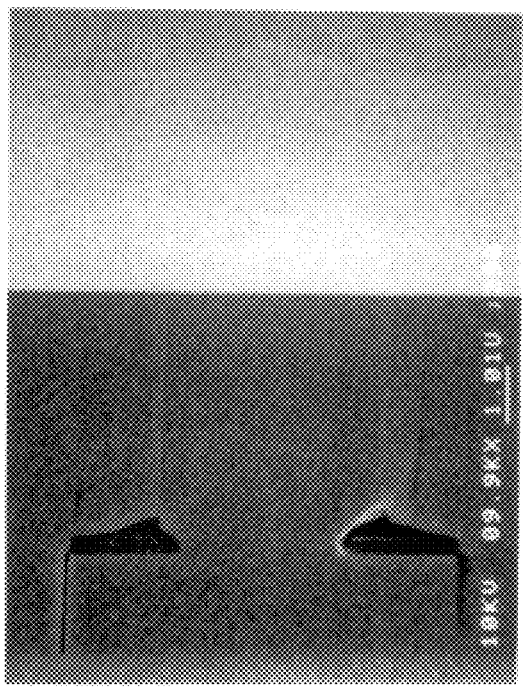
Figure 18B:
Figure 18C:
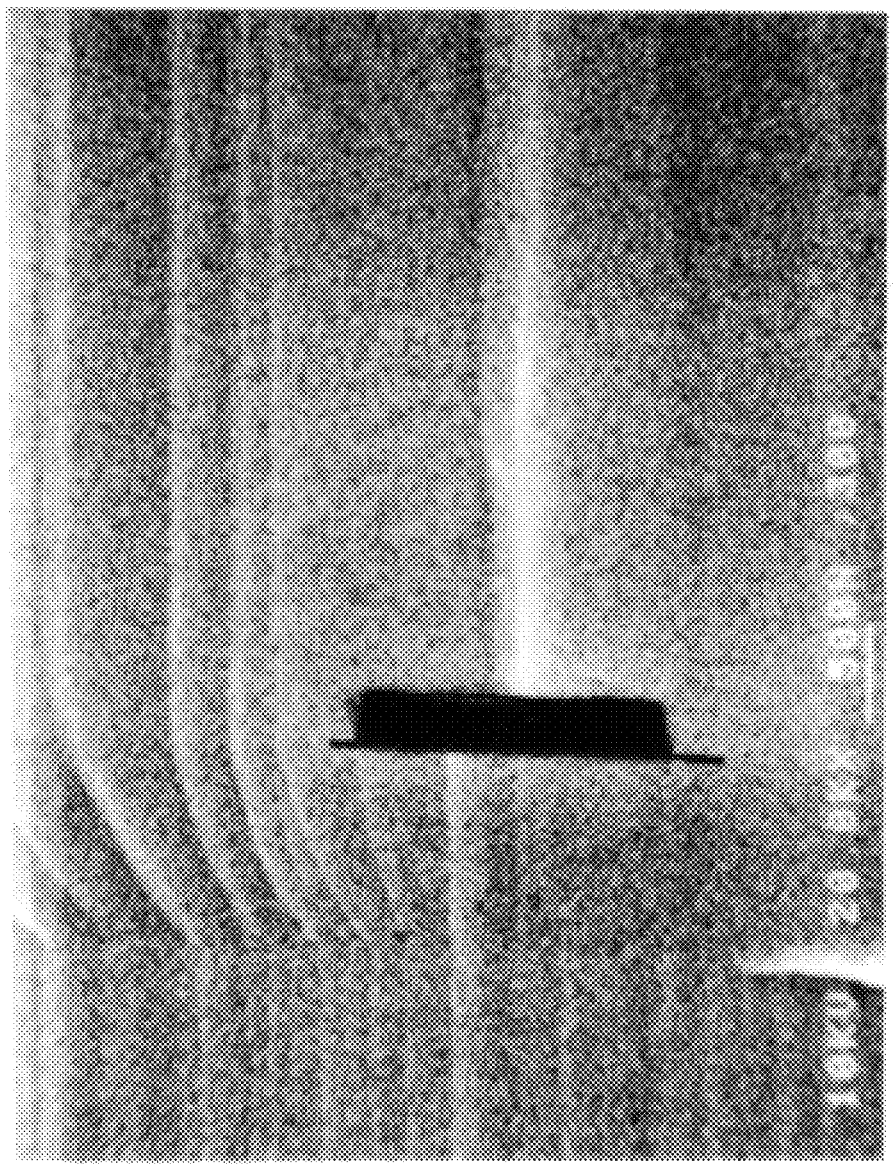

FIGS. 18A and 18B show examples of the case where, on a sapphire substrate, a GaN layer is grown to a thickness of about 2 μm, and, on the GaN layer, there is formed a stripe-shaped SiO$_2$ mask whose stripes each have a width of about 2 μm are formed at intervals of about 3 μm. FIG. 18C shows an example of the case where, on a sapphire substrate, a GaN layer is grown to a thickness of about 2 μm, and thereafter, AlGaN is grown to a thickness of about 2 μm, and, on the AlGaN layer, there is grown a stripe-shaped mask whose stripes each have a width of about 3 μm are formed at intervals of about 3 μm.

The direction of the strips of the SiO$_2$ mask is the <11-20> direction of the sapphire substrate in which the lateral growth is easily promoted by the use of the MOCVD method, that is, the <1-100> direction of the GaN, as set forth in connection with the tenth embodiment.

FIGS. 18A to 18C are the photographs of samples each taken by observing the sample from a section thereof by the use of a scanning electron microscope (SEM). As shown in FIGS. 18A to 18C, on any substrate shown, in that portion where the SiO$_2$ mask does not exist, the growth of GaN proceeds by inheriting the information of the underlying layer, while, in the portion where the SiO$_2$ mask exists, the lateral growth is promoted on the mask, and thus, a GaN layer with a good surface flatness obtained.

However, in case the SiO$_2$ mask exists on the laminate structure of GaN/Sapphire as shown in FIGS. 18A and 18B, voids are found on the mask, and, beneath one side of the mask, cracks are found sporadically. These cracks seem to have been produced due to the strains resulting from the difference between thermal expansion coefficients or the like.

On the other hand, in case the SiO$_2$ mask exists on the laminate structure of AlGaN/GaN/Sapphire as shown in FIG. 18C, no void is observed on the mask; that is, they are completely filled up with the GaN layer by the lateral growth. Further, no crack is found under the mask. It has been clarified that, by using AlGaN on the surface of the substrate used in case a mask such as an SiO$_2$ mask or the like is formed so as to effect the lateral growth of a GaN layer on the thus formed SiO$_2$ mask, the lateral growth characteristics are more improved.

As is apparent from the foregoing tenth and eleventh embodiments, the stripe-shaped mask should desirably be formed in parallel to the <11-20> direction of the sapphire substrate, that is, the <1-100> direction of the GaN, and the width of the mask (the portion in which opening portions are not provided) should desirably be at least 1 μm or greater, more preferably, 3 μm or greater, and, further preferably, 10 μm or greater, and the intervals between the stripes (a width of the opening portions) of the mask should desirably be 10 μm or less and, more preferably, 2 μm or less.

Further, desirable as the substrate on which the mask for effecting a lateral growth is a bulk such as a sapphire substrate, an SiC substrate, an Si substrate, a GaAs substrate, a GaP substrate, a GaN substrate, or the like and, besides the bulk, a desirable substrate is the substrate constituted in such a manner that, on such a bulk, In$_x$Ga$_y$Al$_z$B$_{1-x-y-z}$N (wherein $0 \leq x, y, z \leq 1$) is formed. Above all, if the uppermost surface on which a mask made of, e.g. SiO$_2$ or the like is formed is GaN and, more preferably, AlGaN, then the film obtained through the lateral growth is better in quality. In particular, in case the AlGaN constitutes the underlying layer, neither void nor crack is produced. As the above-mentioned underlying layer, AlGaN, InGaN, AlN, GaN and materials resulting from adding B to these materials, and laminate films made of these materials are preferable.

Further, the film grown on the substrate on which the mask has been formed should most desirably be a GaN film, but may alternatively be a In$_x$Ga$_y$Al$_z$B$_{1-x-y-z}$N film (wherein $0 \leq x, y, z \leq 1$). For instance, it is possible to laterally grow the AlGaN on an AlGaN/GaN/sapphire substrate on which a mask has been formed.

(Twelfth Embodiment)

A twelfth embodiment is constituted in such a manner that, on a CaN/sapphire substrate and an AlGaN/GaN/sapphire substrate, an SiO$_2$ masks each having a width of 12 μm are formed at intervals of 2 μm, in the <11-20> direction of the sapphire substrate, that is, the <1-100> direction of the GaN as set forth in connection with the tenth embodiment, and, on the masks thus formed, a GaN layer is grown to a thickness of about 10 μm, and, by the use of the substrate thus formed, a blue nitride-based semiconductor laser is formed on the substrate.

Further, comparison was made between the characteristics of the semiconductor lasers using different substrates. The method of manufacturing the multi-layer film for the nitride-based semiconductor and the method of manufacturing the element are the same as those used in the case of the eleventh embodiment. In this embodiment, the number of the InGaN-based multi-quantum wells (MQW) is set to 2.

As a result of the fabrication of laser elements, it has been found that the element formed on the AlGaN/GaN/sapphire substrate is higher in yield than the element fabricated on the GaN/sapphire substrate. In the case of using the GaN/sapphire substrate, cracks are caused in the sample during the fabrication process in some cases. In case the AlGaN/GaN/sapphire substrate is used, cracks as mentioned above are not produced, so that the yield is very high. However, according to the evaluation of the dislocation density by means of the transmission electron microscope, in case the GaN/sapphire substrate is used, there is no big difference in comparison with the case where the AlGaN/GaN/sapphire substrate is used, that is, the dislocation density was alike on the level of $10^4$ cm$^{-2}$ in the case of either one of the samples.

Next, the laser characteristics were evaluated. In either one of the above-mentioned samples, it was confirmed that room-temperature continuous oscillation was effected. In the case of the sample using the GaN/sapphire substrate, the threshold current density was about 2.3 kA cm$^{-2}$, and the operating voltage was about 4.8V. Further, in the case of the sample using the AlGaN/GaN/sapphire substrate, the threshold current density was about 1.8 kA cm$^{-2}$, and the operating voltage was about 3.8V.

Next, the room-temperature continuous oscillation was continued to inspect the lifetime of the elements. In the case of the laser element using the GaN/sapphire substrate, the continuous operation was continued for about 5000 hours, and it was found that, from then on, the operating voltage of the element tended to gradually rise; and the lifetime of the element turned out to be 8000 hours. In contrast, in the case of the laser element using the AlGaN/GaN/sapphire substrate, the room-temperature continuous oscillation continued for about 9000 hours, and, from then on, the operating voltage was found to rise similarly, but the lifetime of the element was about 15000 hours.

In the case of either one of the element using the GaN/sapphire substrate and the element using the AlGaN/GaN/sapphire substrate, the yield, the initial characteristics and the reliability thereof were substantially improved as compared with the conventional nitride-based semiconductor laser. In the case of the laser element using the GaN/sapphire substrate, voids are formed on the mask, and cracks are caused under the mask, whereas in the case of the laser element using the AlGaN/GaN/sapphire substrate, such drawbacks are not found. Due to this, it is considered that the yield, the initial characteristics and the reliability have been improved.

(Thirteenth Embodiment)

A thirteenth embodiment is constituted in such a manner that the element structure is formed in the direction of the lateral growth.

FIG. 19 is a sectional view showing the semiconductor laser according to the thirteenth embodiment. First, on a substrate 700 composed in such a manner that, on a sapphire substrate 701, a GaN layer 702, and an AlGaN layer 703 are stacked, an SiO$_2$ mask 704 is formed. Next, from within an opening of the mask 704, a GaN layer 705 is grown.

After the GaN layer 705 has grown vertically up to the height shown, the material percentage composition of Group V and Group III is changed, and, under the growth condition that growth is effected only in the lateral direction, the growth is continued, whereby an element structure constituted in such a manner that the respective layers are stacked in the lateral direction on the mask 704.

To put it in more detail, this laser element comprises the GaN layer 705 positioned in the center, an n-type GaN contact layer 706, an n-type AlGaN clad layer 707, an n-type GaN guide layer 708, an MQW 709, a p-type GaN guide layer 710, a p-type AlGaN layer 711, and a p-type GaN contact layer 712 disposed outwardly from the center in this order.

In the case of a nitride-based semiconductor laser, when the resonator end face is formed, the cleavage method or the dry etching method was used according to the conventional technique, but, for reasons such as the reason that the material is hard, and the reason that, in case a sapphire substrate or the like is used, the surface orientation of the grown layer differs from that of the substrate, the fabrication of the resonator of the laser is difficult, and thus, the mirror surface with a good flatness can hardly be obtained. However, in the case of a laser element fabricated as according to this embodiment, the surface with a very excellent flatness which is naturally obtained by the growth can be directly utilized as the resonator end face, so that the reflection loss in the resonator end face of the laser can be substantially reduced, which is quite a merit.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nitride-based semiconductor element comprising:
 a first layer;
 a mask formed on said first layer, said mask having a plurality of opening portions;
 a nitride-based compound semiconductor layer formed on said mask, said nitride-based semiconductor layer including:
  a first region which has threading dislocations produced in such a manner that, in approximately a middle portion between two adjacent opening portions of said plurality of opening portions in said mask, a plurality of dislocations extend vertically to a surface of said mask; and
  a second region which comprises portions other than said middle portions and free from said dislocations; and
 a desired element structure formed above said mask having said plurality of opening portions.

2. The nitride-based semiconductor element according to claim 1, wherein said desired element structure is formed substantially on said second region.

3. The nitride-based semiconductor element according to claim 1, wherein material of said mask is inactive at a high temperature of 1000° C. or higher in an atmosphere comprising at least one of hydrogen, nitrogen and ammonia.

4. The nitride-based semiconductor element according to claim 1, wherein
said first layer comprises one selected from a group consisting of AlGaN, InGaN, AlN, GaN, and materials obtained by adding B to the foregoing, Si, SiC, sapphire and a laminated film made of the foregoing.

5. The nitride-based semiconductor element according to claim 1, wherein said plurality of opening portions in said mask are each formed into a stripe-like shape extending in a direction perpendicular to an a-axis <11-20> of said nitride-based compound semiconductor layer.

6. The nitride-based semiconductor element according to claim 1, wherein a density of said threading dislocations in said nitride-based compound semiconductor layer ranges from $10^3$ cm$^{-2}$ to $10^7$ cm$^{-2}$ inclusive.

7. The nitride-based semiconductor element according to claim 1, wherein
said nitride-based compound semiconductor layer includes a third region in which a plurality of dislocations extending along the surface of said mask from said plurality of opening portions in said mask, and
said second region exists on said third region.

8. The nitride-based semiconductor element according to claim 1, wherein a surface of said nitride-based compound semiconductor layer on said mask is substantially flat.

9. The nitride-based semiconductor element according to claim 1, wherein said nitride-based compound semiconductor layer is composed of $Ga_xIn_yAl_zB_{1-x-y-z}N$ (wherein $0 \leq x, y, z \leq 1$).

10. The nitride-based semiconductor element according to claim 1, wherein
said mask is constituted in such a manner that, on said first layer, either of a plurality of opening portions which are each triangular or hexagonal in shape and a plurality of un-opened portions are periodically formed,
said nitride-based compound semiconductor layer comprises:
said first region which is formed on said un-opened portions of said mask and in which said threading dislocations are contained in a state extending in a vertical direction to the surface of said mask;
a third region which is formed on said opening portions and said un-opened portions of said mask and, in which said dislocations extend along the surface of said mask; and
said second region which is formed on said third region and free from said dislocations.

11. The nitride-based semiconductor element according to claim 1, wherein
said first layer has a plurality of projections periodically formed on a surface thereof,
on surfaces of said projections, said un-opened portions of said mask are formed, and in said opening portions of said mask, said underlying layer forms a junction with said nitride-based compound semiconductor layer.

12. A nitride-based light emitting element comprising:
a first layer;
a mask formed on said first layer, said mask having a plurality of opening portions;
a nitride-based compound semiconductor layer formed on said mask, said nitride-based semiconductor layer including:
a first region which has threading dislocations produced in such a manner that, in approximately a middle portion between two adjacent opening portions of said plurality of opening portions in said mask, a plurality of dislocations extend vertically to a surface of said mask; and
a second region which comprises portions other than said middle portions and free from said dislocations; and
a light-emitting layer formed above said mask having said plurality of opening portions, said light-emitting layer being sandwiched between current injection layers.

13. The nitride-based light-emitting element according to claim 12, wherein material of said mask is inactive at a high temperature of 1000° C. or higher in an atmosphere comprising at least one of hydrogen, nitrogen and ammonia.

14. The nitride-based light-emitting element according to claim 12, wherein said first layer is composed of one selected from a group consisting of AlGaN, InGaN, AlN, GaN, materials resulting from adding B into the foregoing, Si, SiC, sapphire and a laminate film made of the foregoing.

15. The nitride-based light-emitting element according to claim 12, wherein said plurality of opening portions in said mask are each formed into a stripe-like shape extending in a direction perpendicular to an a-axis <11-20> of said nitride-based compound semiconductor layer.

16. The nitride-based light-emitting element according to claim 12, wherein a density of said threading dislocations in said nitride-based compound semiconductor layer ranges from $10^3$ cm$^{-2}$ to $10^7$ cm$^{-2}$ inclusive.

17. A nitride-based semiconductor element comprising:
a first layer;
a mask formed on said first layer, said mask having a plurality of opening portions;
a nitride-based flattening semiconductor layer formed on said mask; and
a desired element structure formed on said mask with said nitride-based flattening semiconductor layer interposed therebetween.

18. The nitride-based semiconductor element according to claim 7, wherein said desired element structure is a light-emitting element including an active layer sandwiched between two clad layers.

* * * * *